(12) United States Patent
Gohara et al.

(10) Patent No.: US 9,293,391 B2
(45) Date of Patent: Mar. 22, 2016

(54) SEMICONDUCTOR MODULE COOLER AND SEMICONDUCTOR MODULE

(75) Inventors: Hiromichi Gohara, Matsumoto (JP); Akira Morozumi, Okaya (JP); Takeshi Ichimura, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/351,033

(22) PCT Filed: Sep. 5, 2012

(86) PCT No.: PCT/JP2012/072554
§ 371 (c)(1),
(2), (4) Date: May 8, 2014

(87) PCT Pub. No.: WO2013/054615
PCT Pub. Date: Apr. 18, 2013

(65) Prior Publication Data
US 2014/0252590 A1 Sep. 11, 2014

(30) Foreign Application Priority Data
Oct. 12, 2011 (JP) ................................. 2011-224469

(51) Int. Cl.
*H01L 23/473* (2006.01)
*H01L 23/373* (2006.01)
(Continued)

(52) U.S. Cl.
CPC ................ *H01L 23/473* (2013.01); *F28F 3/02* (2013.01); *F28F 3/12* (2013.01); *F28F 9/026* (2013.01);
(Continued)

(58) Field of Classification Search
CPC .......... H05K 7/20236; H05K 7/20254; H05K 7/20927; H01L 23/473; H01L 23/3735; H01L 2924/0002; F28F 3/02; F28F 3/12; F28F 9/026; H02M 7/003
USPC ........................ 257/715; 165/104.33; 361/699
See application file for complete search history.

(56) References Cited

U.S. PATENT DOCUMENTS 2,934,322 A 4/1960 Hazard
5,737,186 A 4/1998 Fuesser et al.
(Continued)

FOREIGN PATENT DOCUMENTS

DE 19514545 A1 10/1996
EP 2234153 A1 9/2010
(Continued)

OTHER PUBLICATIONS

PCT, "International Search Report for International Application No. PCT/JP2012/072554".
(Continued)

*Primary Examiner* — Karen Kusumakar
*Assistant Examiner* — Adam S Bowen
(74) *Attorney, Agent, or Firm* — Manabu Kanesaka

(57) ABSTRACT

A semiconductor module cooler for supplying a refrigerant from exterior into a water jacket and cooling a semiconductor device disposed on an outer surface of the cooler, includes a heat sink thermally connected to the semiconductor device; a first flow path extending from a refrigerant inlet and arranged with a guide portion having an inclined surface for guiding the refrigerant toward one side surface of the heat sink; a second flow path extending toward a refrigerant outlet and formed with a sidewall parallel to the other side surface of the heat sink; a flow velocity adjustment plate disposed in the second flow path and formed parallel to the other side surface of the heat sink at a distance therefrom; and a third flow path formed at a position communicating the first flow path and the second flow path. The heat sink is disposed in the third flow path.

10 Claims, 18 Drawing Sheets

(51) Int. Cl.
*H05K 7/20* (2006.01)
*F28F 3/12* (2006.01)
*F28F 9/02* (2006.01)
*F28F 3/02* (2006.01)
*H02M 7/00* (2006.01)

(52) U.S. Cl.
CPC ........ *H01L 23/3735* (2013.01); *H05K 7/20927* (2013.01); *H01L 2924/0002* (2013.01); *H02M 7/003* (2013.01)

(56) References Cited

U.S. PATENT DOCUMENTS

| | | | |
|---|---|---|---|
| 5,978,220 A * | 11/1999 | Frey et al. | 361/699 |
| 8,933,557 B2 | 1/2015 | Gohara et al. | |
| 2006/0225867 A1* | 10/2006 | Park et al. | 165/80.4 |
| 2008/0237847 A1 | 10/2008 | Nakanishi et al. | |
| 2009/0178792 A1 | 7/2009 | Mori et al. | |
| 2009/0314474 A1 | 12/2009 | Kimbara et al. | |
| 2010/0051234 A1 | 3/2010 | Mori et al. | |
| 2010/0090336 A1* | 4/2010 | Yoshida et al. | 257/717 |
| 2010/0252235 A1 | 10/2010 | Mori et al. | |
| 2014/0252590 A1 | 9/2014 | Gohara et al. | |

FOREIGN PATENT DOCUMENTS

| | | |
|---|---|---|
| JP | 2001-035981 A | 2/2001 |
| JP | 2001-352025 A | 12/2001 |
| JP | 2006-080211 A | 3/2006 |
| JP | 2006-210819 A | 8/2006 |
| JP | 2007-012722 A | 1/2007 |
| JP | 2008-205371 A | 9/2008 |
| JP | 2008-263137 A | 10/2008 |
| JP | 2009-266936 A | 11/2009 |
| JP | 2010-203694 A | 9/2010 |
| JP | 2011-134979 A | 7/2011 |
| WO | 2011/018882 A1 | 2/2011 |
| WO | 2013/054887 A1 | 4/2013 |

OTHER PUBLICATIONS

Japan Patent Office, "Office Action for JP 2013-538476," Sep. 1, 2015.
Europe Patent Office, "Search Report for EP 12839889.8," Jun. 2, 2015.

* cited by examiner

FLOW PATH SHAPE OF EACH TYPE (FLOW PATH WIDTH W1=W2=15mm)

| SHAPE OF REFRIGERANT FLOW PATH | DIMENSIONS OF FLOW VELOCITY ADJUSTMENT PLATE | | | |
|---|---|---|---|---|
| | L[mm] | x2[mm] | y2[mm] | h[mm] |
| TYPE E | 175 | 0 | 2 | 9.5 |
| TYPE Ea | 175 | 0 | 2 | 7.5 |
| TYPE Eb | 175 | 0 | 2 | 5.5 |
| TYPE F | 215 | 0 | 2 | 9.5 |
| TYPE Fa | 215 | 0 | 2 | 7.5 |
| TYPE Fb | 215 | 0 | 2 | 5.5 |
| TYPE Fc | 215 | 5 | 2 | 9.5 |

Fig. 12

FLOW PATH DIMENSIONS OF EACH TYPE

| SHAPE OF REFRIGERANT FLOW PATH | DIMENSIONS OF FLOW VELOCITY ADJUSTMENT PLATE (NOTE THAT x2=0[mm]) | | | FLOW PATH WIDTH | |
|---|---|---|---|---|---|
| | L[mm] | h[mm] | y2[mm] | w1[mm] | w2[mm] |
| TYPE G | 255 | 2 | 2 | 10 | 15 |
| TYPE Ga | 255 | 4 | 2 | 10 | 15 |
| TYPE Gb | 255 | 6 | 2 | 10 | 15 |
| TYPE Gc | 255 | 8 | 2 | 10 | 15 |
| TYPE H | 255 | 8 | 2 | 15 | 15 |
| TYPE I | 255 | 8 | 2 | 12.5 | 15 |

Fig. 17

SEMICONDUCTOR MODULE COOLER AND SEMICONDUCTOR MODULE

RELATED APPLICATIONS

The present application is National Phase of International Application No. PCT/JP2012/072554 filed Sep. 5, 2012, and claims priorities from Japanese Application No. 2011-224469 filed Oct. 12, 2011.

TECHNICAL FIELD

The present invention relates to a semiconductor module cooler for cooling semiconductor devices, and a semiconductor module wherein a refrigerant is supplied from the exterior to a water jacket forming the cooler to cool the semiconductor devices disposed on the outer surface of the cooler.

BACKGROUND ART

A semiconductor module is widely used in a power conversion system typically used in a hybrid automobile, an electric automobile, or the like. This kind of semiconductor module configuring a control device for energy saving includes a power semiconductor device which controls large current. A normal power semiconductor device generates heat when controlling large current, but the amount of heat generated by the power semiconductor device increases as the size of the power conversion system is reduced and the output thereof is increased. Therefore, the method of cooling a semiconductor module including a plurality of power semiconductor devices becomes a major problem.

A liquid cooling device has heretofore been used in order to improve the cooling efficiency of a semiconductor module. For the liquid cooling device, various ideas have been made in order to improve the cooling efficiency thereof, such as increasing a refrigerant flow rate, forming radiating fins (a cooling body) in a shape with good heat transfer coefficient, or increasing the heat conductivity of a material forming the fins.

However, when increasing the flow rate of the refrigerant supplied to the cooling device or using a complex fin shape with good heat transfer coefficient, a load on a cooling pump for circulating the refrigerant increases, such as due to an increase in refrigerant pressure loss inside the device. In particular, with a cooling device which cools a large number of power semiconductor devices using a plurality of heat sinks, an increase in pressure loss is noticeable in the case of a flow path configuration wherein a plurality of flow paths is connected in series. In order to reduce the pressure loss, it is ideal to use a configuration which enhances cooling efficiency with a low refrigerant flow rate, and it is only necessary to improve, for example, the heat conductivity of a fin material, but there is an issue that the employment of a fin material having high heat conductivity leads to an overall cost increase of the device.

Heretofore, in order to reduce the pressure loss while maintaining cooling performance, a cooling device has been considered wherein a refrigerant inlet flow path for supplying the refrigerant and a refrigerant outlet flow path for discharging the refrigerant are aligned parallel to each other, and a plurality of heat sinks is disposed between the inlet and outlet flow paths in a direction of refrigerant circulation substantially perpendicular to the flow paths (refer to PTLs 1 to 8). In this case, the refrigerants flow in parallel between the fins configuring the heat sinks, meaning that it is possible to improve cooling performance, and it is possible to reduce the refrigerant pressure loss in the flow paths (refer to PTL 5)

Also, PTL 3 describes a liquid cooling device wherein flow paths (header channels 11a and 11b) which feed in and discharge a cooling liquid are disposed in the same side surface of the module, and each flow path is disposed in a direction perpendicular to fins without changing the sectional area (refer to FIG. 1). Thus, it is possible to minimize a pressure loss incurred in the cooling liquid.

Also, PTL 6 describes a liquid cooling device wherein the whole rear sidewall of a casing forming a cooling liquid inflow portion is smoothly inclined frontward from a right sidewall side toward a left sidewall side, and the flow path sectional area of an entrance header portion decreases from a cooling liquid entrance side toward the left sidewall side. Thus, a flow velocity distribution in the whole flow path of parallel flow path portions of the casing, that is, a flow velocity distribution in a direction of width of the parallel flow path portions, is made uniform.

CITATION LIST

Patent Literature

PTL 1: JP-A-2001-35981 (refer to paragraph [0020] and FIG. 1)
PTL 2: JP-A-2007-12722 (refer to paragraph [0006] and FIG. 7)
PTL 3: JP-A-2008-205371 (refer to paragraph [0021] and FIG. 1)
PTL 4: JP-A-2008-251932 (refer to paragraphs [0037] and [0038] and FIG. 7)
PTL 5: JP-A-2006-80211 (refer to paragraph [0006] and FIG. 1)
PTL 6: JP-A-2009-231677 (refer to paragraphs [0024] and [0031] and FIG. 2)
PTL 7: JP-A-2006-295178 (refer to paragraphs [0017] to [0024] and FIG. 2)
PTL 8: JP-A-2010-203694 (refer to paragraph [0026] and FIG. 3)

SUMMARY OF INVENTION

Technical Problem

However, with the heretofore known cooling technologies, a biased flow distribution wherein the refrigerant flows unevenly through a cooler occurs because of the shape of heat sinks or refrigerant flow paths, the method of disposing heat generation elements, the shape of a refrigerant inlet and outlet, or the like. As this kind of biased flow distribution leads to unevenness in cooling performance, it has been difficult to obtain uniform and stable cooling performance with the heretofore known cooling devices. Moreover, as there also arises a problem of a marked increase in only the temperature of heat generated by semiconductor devices disposed in positions extremely opposite to the refrigerant outlet side, or the like, there has been a problem that the life span of the semiconductor devices is lowered, or failure or the like is likely to occur.

Also, there is a trend for improvement in flow rate distribution when the flow path sectional area of the entrance header portion decreases in a direction of extension, as in the cooling devices disclosed in PTL 6 and 7, but an increase in temperature in the vicinity of the refrigerant inlet has not been resolved, and an increase in pressure loss is likely to be brought about simply by adjusting the flow velocity by changing the shape of the inlet flow path.

Meanwhile, with a liquid cooling device of PTL 8, as a plurality of flow path groups, with different flow path resistances, each being formed of a plurality of flow paths is provided in a parallel flow path portion so as to be aligned in a direction of width of the parallel flow path portion, it is possible to form a flow velocity distribution in the direction of width of the parallel flow path portion uniform, and it is possible to prevent a portion in which cooling performance decreases from occurring due to a decrease in flow velocity. However, it is not easy to obtain stable cooling performance due to the effect of, for example, fin base warpage occurring in the process of manufacturing the cooling device.

The invention, having been bearing in mind of these kinds of point, has an object of providing a semiconductor module cooler wherein by adjusting a refrigerant flow velocity distribution based on a biasedflow occurring in flow paths and on a heat generation distribution of semiconductor devices, it is possible to resolve an increase in the temperature of only one portion of the semiconductor devices, and uniformly and stably cool the semiconductor devices.

Also, the invention has an object of providing a semiconductor module wherein by effectively cooling the semiconductor devices, it is possible to reliably prevent malfunction and breakage due to heat generation of the semiconductor devices.

Solution to Problem

In the invention, in order to solve the heretofore described problems, there is provided a semiconductor module cooler for supplying a refrigerant from exterior to a water jacket and cooling semiconductor devices disposed on an outer surface of the cooler. The semiconductor module cooler includes a heat sink thermally connected to the semiconductor devices; a first flow path disposed inside the water jacket and extending from a refrigerant inlet, in which is disposed a guide portion having an inclined surface for guiding the refrigerant toward one side surface of the heat sink; a second flow path disposed inside the water jacket parallel to the first flow path at a distance therefrom and extending toward a refrigerant outlet, the second flow path being formed therein with a sidewall parallel to the other side surface of the heat sink; a flow velocity adjustment plate disposed in the second flow path and formed parallel to the other side surface of the heat sink at a distance therefrom; and a third flow path formed in a position communicating the first flow path and second flow path inside the water jacket. The heat sink is disposed in the third flow path.

Also, a semiconductor module for supplying a refrigerant from the exterior to a water jacket constituting a cooler and cooling semiconductor devices disposed on an outer surface of the cooler, includes a heat sink thermally connected to the semiconductor devices; a first flow path disposed inside the water jacket and extending from a refrigerant inlet, the first flow path being arranged with a guide portion having an inclined surface for guiding the refrigerant toward one side surface of the heat sink; a second flow path disposed inside the water jacket parallel to the first flow path at a distance therefrom and extending toward a refrigerant outlet, the second flow path being formed therein with a sidewall parallel to the other side surface of the heat sink; a flow velocity adjustment plate disposed in the second flow path and formed parallel to the other side surface of the heat sink at a distance therefrom; and a third flow path formed at a position communicating the first flow path and the second flow path. The refrigerant inlet and refrigerant outlet are formed in a same wall surface of the water jacket, and the heat sink is disposed in the third flow path.

Advantageous Effects of Invention

According to the semiconductor module cooler and semiconductor module of the invention, it is possible to adjust the flow velocity of the refrigerant flowing into the one side surface from the first flow path by the flow velocity adjustment plate being disposed in the second flow path extending toward the refrigerant outlet so as to be spaced parallel from the other side surface of the heat sink. Also, it is possible to adjust the flow velocity distribution of the refrigerant flowing into the heat sink by concurrently using the guide portion having the inclined surface in the first flow path. Consequently, it is possible to effectively cool the semiconductor devices disposed on the outer surface of the cooler, thus enabling a stable operation of the semiconductor devices.

The heretofore described and other objects, features, and advantages of the invention will be clarified by the following description relating to the attached drawings illustrating preferred embodiments as examples of the invention.

BRIEF DESCRIPTION OF DRAWINGS

FIGS. 4(A), 4(B) are diagrams illustrating two fin shapes, wherein FIG. 4(A) is a perspective view showing blade fins, and FIG. 4(B) is a perspective view showing corrugated fins.

FIGS. 6(A), 6(B) are diagrams illustrating a heretofore known semiconductor module as a first comparison example, wherein FIG. 6(A) is a perspective view showing an example of disposition of circuit elements, and FIG. 6(B) is a perspective view showing a main portion configuration of a water jacket of the cooler.

FIGS. 8(A), 8(B) are diagrams illustrating a heretofore known semiconductor module as a fourth comparison example, wherein FIG. 8(A) is a plan view showing a shape of a water jacket, and FIG. 8(B) is a fragmentary perspective view thereof.

FIG. 12 is an illustration showing dimensions for each type of a flow velocity adjustment plate of the semiconductor module cooler of FIG. 11.

FIG. 17 is an illustration showing dimensions for each type of a flow velocity adjustment plate, and of flow path widths of an inlet and outlet, in the semiconductor module of FIG. 16.

FIGS. 18(A), 18(B) show cooling characteristics of the water jacket of FIG. 16, wherein FIG. 18(A) is a diagram showing for each type a refrigerant flow velocity distribution per circuit board position, and FIG. 18(B) is a diagram showing for each type a pressure loss difference between at the inlet and at the outlet.

DESCRIPTION OF EMBODIMENTS

Figure 1:
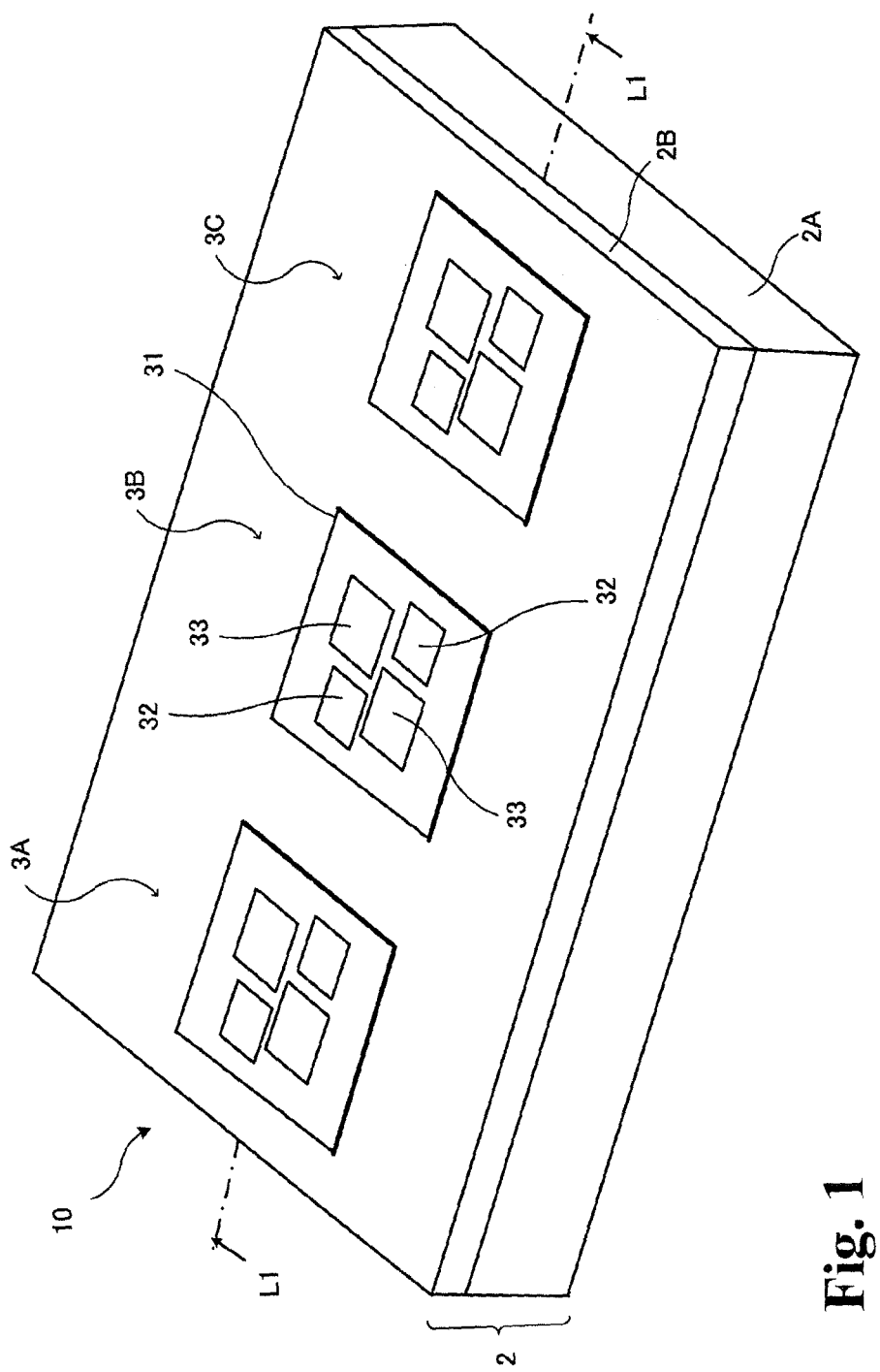
FIG. 1 is an external perspective view showing one example of a semiconductor module of the invention.
Figure 2:
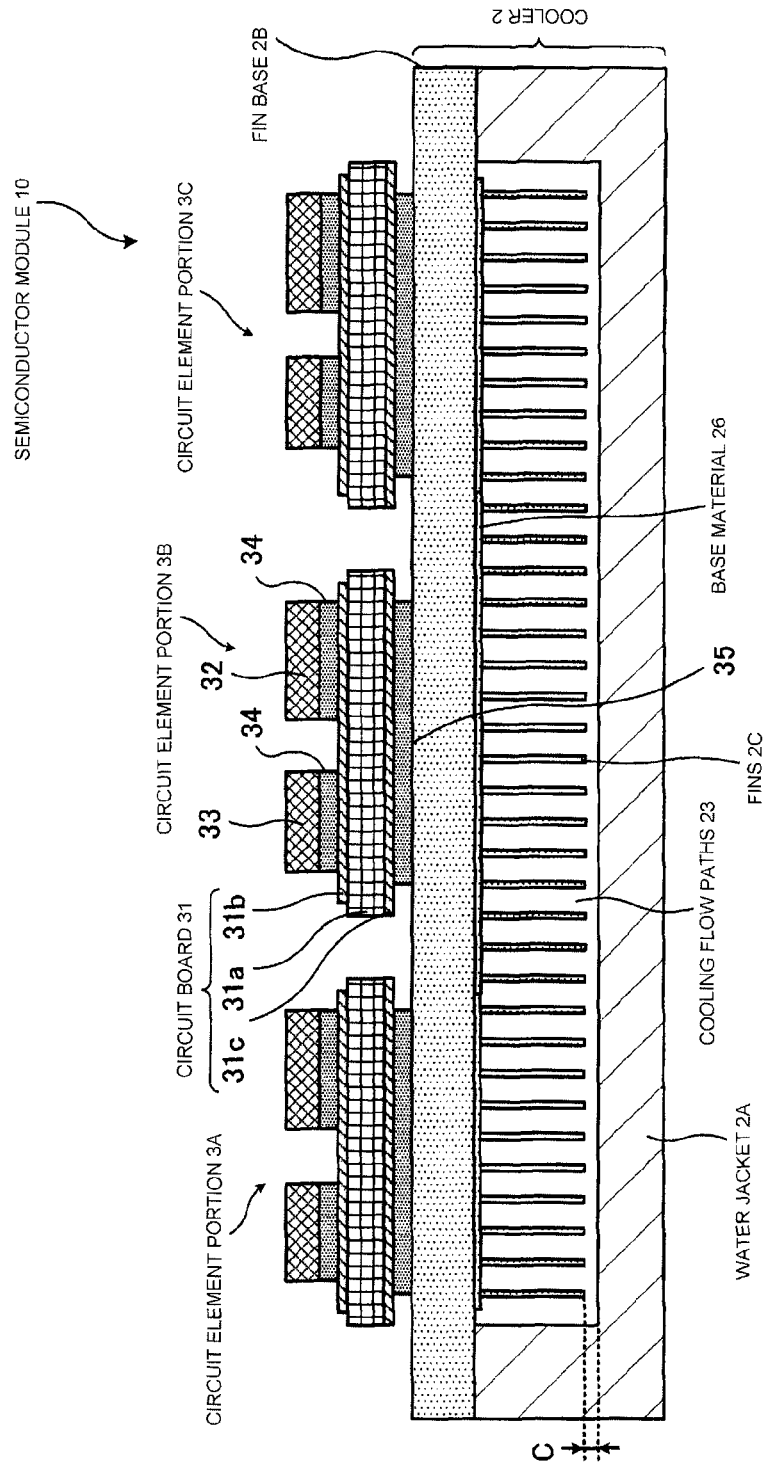
FIG. 2 is a sectional view along line L1-L1 of the semiconductor module of FIG. 1.
Figure 3:
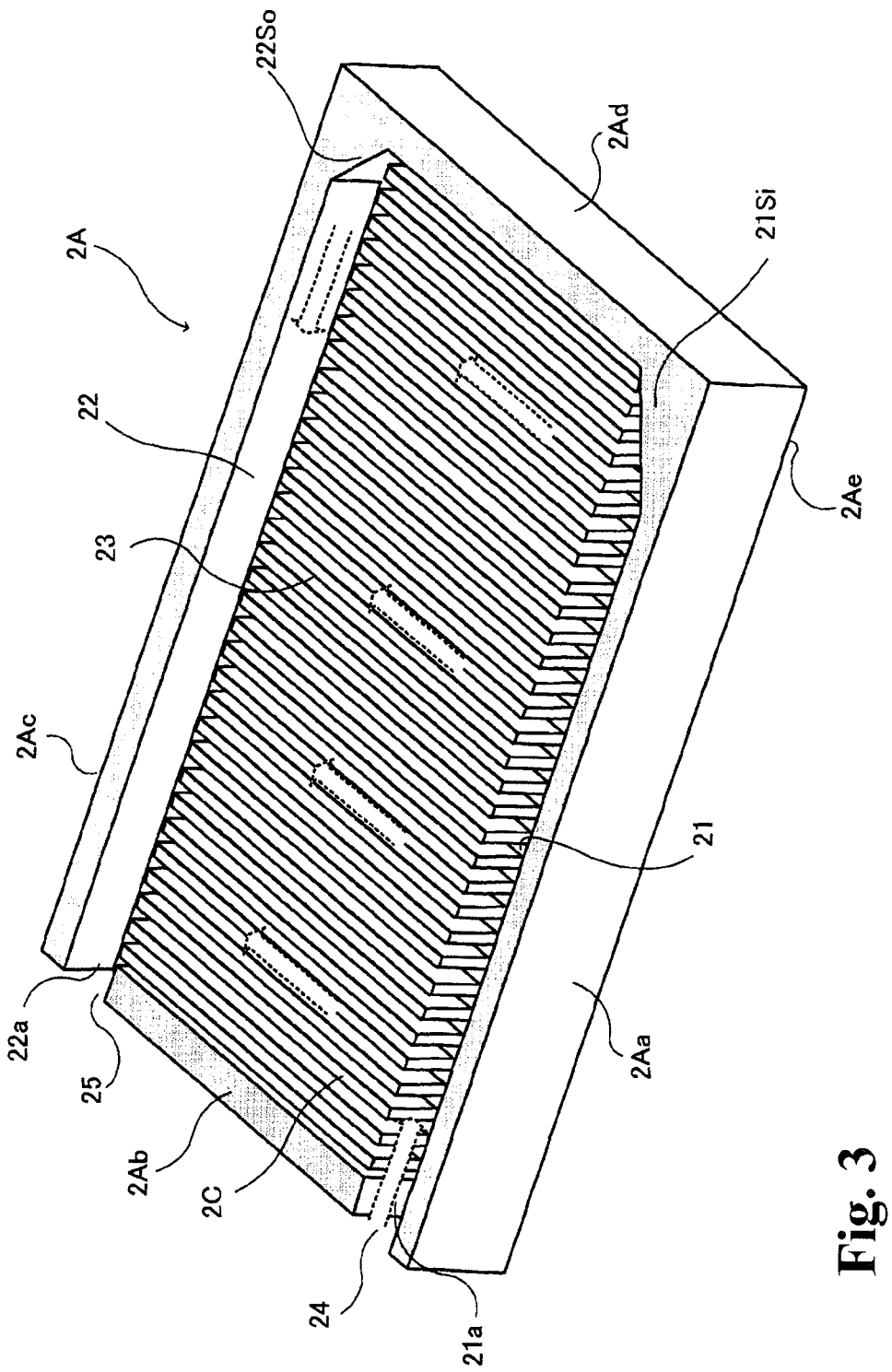
FIG. 3 is a perspective view showing a main portion configuration of a water jacket of a cooler.

FIG. 1 is an external perspective view showing one example of a semiconductor module of the invention, and FIGS. 2 and 3 are respectively an arrow sectional view showing along line L1-L1 of the semiconductor module of FIG. 1 and a perspective view showing a main portion configuration of a water jacket of a cooler. The arrows in FIG. 3 indicate a direction in which a refrigerant flows.

A semiconductor module 10, as shown in FIGS. 1 and 2, is configured of a cooler 2 and a plurality of circuit element portions 3A to 3C disposed on the cooler 2. The cooler 2 is configured of a water jacket 2A acting as a fin cover and a fin base 2B in which a plurality of fins 2C is implanted to act as a heat sink, wherein the plurality of fins 2C is housed inside the water jacket 2A.

In the following description, with regard to the water jacket 2A and the fins 2C housed inside the water jacket 2A, the side on which the fin base 2B is mounted in FIG. 2 is taken to be an "upper side", the arrow view direction with the upper side of the water jacket 2A upward in FIG. 3 is taken to be a "front side", the side on which a refrigerant inlet portion 21a and outlet portion 22a are formed is taken to be a "left side", and the like. Also, with regard to a refrigerant flow in the cooler 2, the side near an inlet 24 is taken to be an "upstream side".

As shown in FIG. 3, the external shape of the water jacket 2a of the cooler 2 is a substantially rectangular parallelepiped shape. The upper side principal surface of the cooler 2 is provided with a refrigerant inlet flow path 21, the inlet portion 21a, a refrigerant outlet flow path 22, the outlet portion 22a, and cooling flow paths 23 in which the fins 2C are disposed. Furthermore, the inlet 24 for feeding the refrigerant into the interior and an outlet 25 for discharging the refrigerant to the exterior are provided in a left sidewall 2Ab of the water jacket 2A. The refrigerant inlet flow path 21 and the like are defined by a front sidewall 2Aa, the left sidewall 2Ab, a rear sidewall 2Ac, a right sidewall 2Ad, and a bottom wall 2Ae. The fins 2C are illustrated in FIG. 3, for simplification of description.

As a first flow path along a direction in which the refrigerant flows in, the refrigerant inlet flow path 21 is extended, parallel to the front sidewall 2Aa of the water jacket 2A, from the inlet 24 via the inlet portion 21a to the right sidewall 2Ad. Also, as a second flow path toward the refrigerant outlet 25, the refrigerant outlet flow path 22 is extended, parallel to the rear sidewall 2Ac of the water jacket 2A, from the right sidewall 2Ad to the outlet portion 22a. The refrigerant inlet flow path 21 and refrigerant outlet flow path 22 are provided linearly and substantially parallel to each other inside the water jacket 2A. Herein, guide portions 21Si and 22So having an inclination of 60° or less are formed respectively in a terminating portion of the refrigerant inlet flow path 21 into which the refrigerant flows from the inlet 24 and in a beginning portion of the refrigerant outlet flow path 22 which discharges the refrigerant to the outlet 25.

The cooling flow paths 23, being disposed as a third flow path in an intermediate position between the refrigerant inlet flow path 21 and refrigerant outlet flow path 22, are formed so as to provide communication between the refrigerant inlet flow path 21 and refrigerant outlet flow path 22. That is, the cooling flow paths 23 extend in a direction perpendicular to the direction of extension of the refrigerant inlet flow path 21 and the direction of extension of the refrigerant outlet flow path 22. The inner surfaces of the left sidewall 2Ab and right sidewall 2Ad, which define the boundary of the cooling flow paths 23, are formed perpendicular to the bottom surface of the cooling flow paths 23 and the inner surface of the rear sidewall 2Ac.

The heat sink formed of the plurality of fins 2C implanted in a base material 26 is formed in the cooling flow paths 23, and the refrigerant flows through each of flow paths defined by the fins 2C. Further, the refrigerant fed in from the inlet 24 passes through the refrigerant inlet flow path 21, cooling flow paths 23, and refrigerant outlet flow path 22, and is discharged from the outlet 25. The heat sink, the external shape of which is a substantially rectangular parallelepiped, is disposed in the cooling flow paths 23 so that the left-side side surface, rear-side side surface, and right-side side surface are parallel to the respective inner surfaces of the corresponding left sidewall 2Ab, rear sidewall 2Ac, and right sidewall 2Ad.

The water jacket 2A having this kind of configuration can be formed using, for example, a metal material such as aluminium, an aluminium alloy, copper, or a copper alloy. When forming the water jacket 2A using this kind of metal material, the heretofore described kinds of refrigerant inlet flow path 21, refrigerant outlet flow path 22, cooling flow path 23, inlet 24, and outlet 25 can be formed by, for example, die casting. Other than this, a material containing a carbon filler can also be used for the water jacket 2A. Also, it is also possible to use a ceramic material, a resin material, or the like, depending on the type of the refrigerant, the temperature of the refrigerant flowing through the water jacket 2A, or the like.

The water jacket 2A having this kind of configuration is such that the surface side on which are formed the refrigerant inlet flow path 21, refrigerant outlet flow path 22, and plurality of cooling flow paths 23 is sealed with the fin base 2B, except the refrigerant inlet 24 and outlet 25, as shown in FIGS. 1 and 2. Also, the base material 26 with the plurality of fins 2C implanted therein is joined to the water jacket 2A side of the fin base 2B.

Next, a description will be given of a shape of the fins 2C configuring the cooler 2.

Figure 4B:
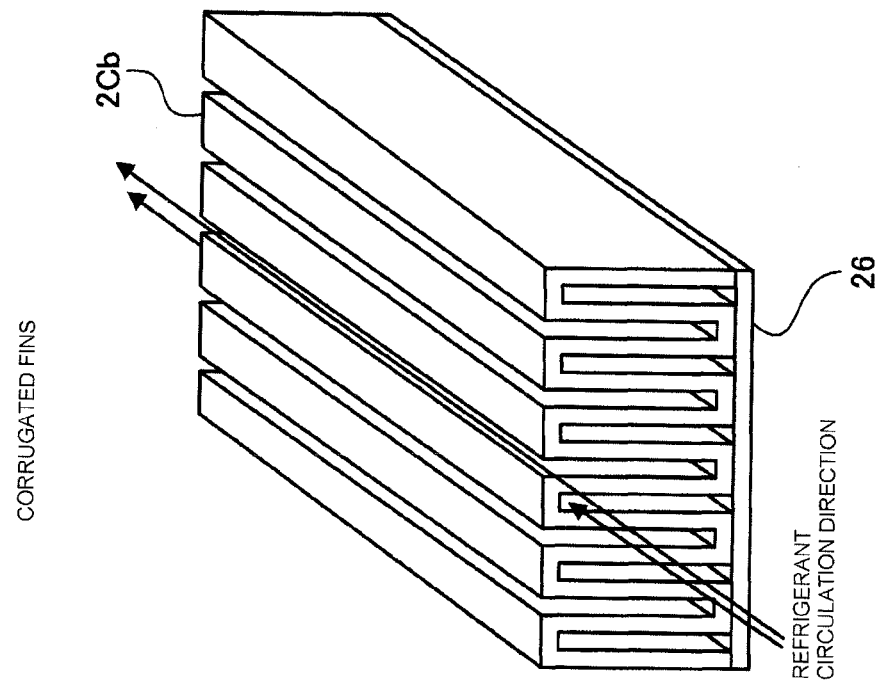
Figure 4A:
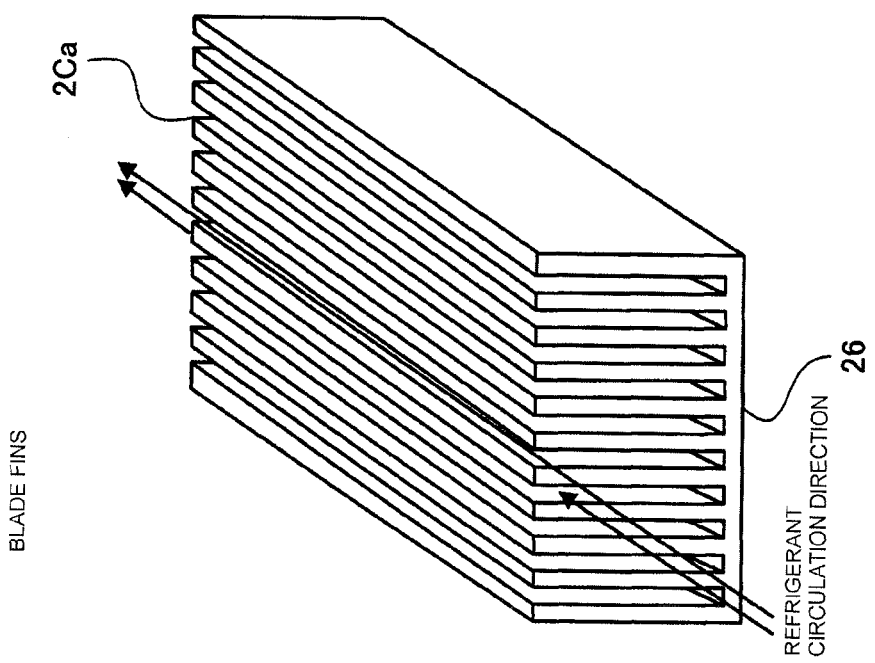

FIGS. 4(A), 4(B) are diagrams illustrating two fin shapes, wherein FIG. 4(A) is a perspective view showing blade fins, and FIG. 4(B) is a perspective view showing corrugated fins.

The fins 2C of the cooler 2 can be formed as a plurality of blade fins 2Ca wherein plate-like fins are arranged in parallel, as shown in, for example, FIG. 4(A). The blade fins 2Ca are disposed in the cooling flow paths 23, and the refrigerant circulates in a direction shown by the arrows in FIG. 4(A). At this time, these kinds of blade fin 2Ca are held by the base material 26 and fin base 2B in the cooling flow paths 23.

The blade fins 2Ca are illustrated in FIG. 4(A), but it is also possible to use corrugated fins 2Cb shown in FIG. 4(B).

These kinds of fin 2C having the shape of the blade fins 2Ca or corrugated fins 2Cb are integrated with the fin base 2B and disposed with the fin 2C side turned to face the water jacket 2A, as shown in, for example, FIG. 2. The fins 2C are formed to a dimension (a height) such that a certain clearance C exists between the leading ends of the fins 2C and the bottom wall 2Ae of the water jacket 2A.

In FIG. 2, the base material 26 is configured integrally with the fin base 2B, and when the fin base 2B is disposed with the fin 2C side thereof turned to face the water jacket 2A, the fins 2C are disposed in the cooling flow paths 23 of the water jacket 2A. It is also possible to form the fins 2C integrally with the fin base 2B itself by die casting, brazing, any kind of welding, or the like, or after forming the fins 2C in a convex shape from the fin base 2B by die casting or pressing, to process the convex-shaped fins 2C into a desired fin shape by a cutting or wire cutting method.

As this kind of fin shape of the fins 2C, it is possible to use various heretofore known shapes. As the fins 2C are resistant to the refrigerant flowing through the cooling flow paths 23, it is desirable that the fins 2C are of a low pressure loss to the refrigerant. Also, it is preferable that the shape and dimension of the fins 2C are appropriately set taking into consideration conditions for feeding the refrigerant into the cooler 2 (that is, pump performance and the like), types of refrigerant (viscosity and the like), an intended amount of heat removal, and the like.

Also, the external shape of the heat sink formed of the fins 2C are an approximate rectangular parallelepiped, preferably, a rectangular parallelepiped, or may be a shape wherein the rectangular parallelepiped is chamfered or modified as long as it does not impair the advantageous effects of the invention.

The fins 2C and fin base 2B can be formed using, for example, a metal material such as aluminium, an aluminium alloy, copper, or a copper alloy, in the same way as the water jacket 2A. The fins 2C can be formed by, for example, joining predetermined pins or plate bodies formed using a metal material to a metal base material 26, apart from the heretofore described blade fins 2Ca and corrugated fins 2Cb or the like.

The base material 26 with the fins 2C implanted therein in this way are joined to a predetermined region of the fin base 2B of a metal plate or the like, that is, a region corresponding to the cooling flow paths 23 shown in FIG. 2. It is not only that the base material 26 with the fins 2C implanted therein in advance are joined to the fin base 2B in this way, but it is also possible to configure the heat sink by joining the plurality of fins 2C directly to the fin base 2B.

When using the cooler 2, a pump provided on the upstream side of the cooler 2 is connected to, for example, the inlet 24, and the outlet 25 is connected to a heat exchanger provided on the downstream side of the cooler 2, thus configuring a closed loop refrigerant flow path including the cooler 2, pump, and heat exchanger. The refrigerant is forcedly circulated in this kind of closed loop by the pump.

Each circuit element portion 3A to 3C has a configuration wherein a total of four semiconductor devices, two for each of two types 32 and 33, are mounted on a board 31, as shown in, for example, FIG. 2. The board 31 is configured so that conductor patterns 31b and 31c are formed one on each surface of an insulating substrate 31a, as shown in, for example, FIG. 2.

For example, a ceramic substrate of aluminium nitride or aluminium oxide can be used as the insulating substrate 31a of the board 31. The conductor patterns 31b and 31c on the insulating substrate 31a can be formed using a metal (for example, a copper foil) such as copper or aluminium.

The semi conductor devices 32 and 33 are joined to the conductor pattern 31b side of the board 31 using their respective joining layers 34 of solder or the like, and electrically connected to the same conductor pattern 31b directly or via their respective wires (not shown). The board 31 with the semiconductor devices 32 and 33 mounted thereon are joined to the fin base 2B of the cooler 2, via a joining layer 35, on the other conductor pattern 31c side.

In this way, the board 31 and the semiconductor devices 32 and 33 mounted on the board 31 attain a condition in which they are thermally connected to the cooler 2. A protection layer for protecting the exposed and wire surfaces against contamination, corrosion, external force, or the like, may be formed on exposed surfaces of the conductor patterns 31b and 31c, and wire surfaces which electrically connect the semiconductor devices 32 and 33 and conductor pattern 31b, by nickel plating or the like.

Figure 5:
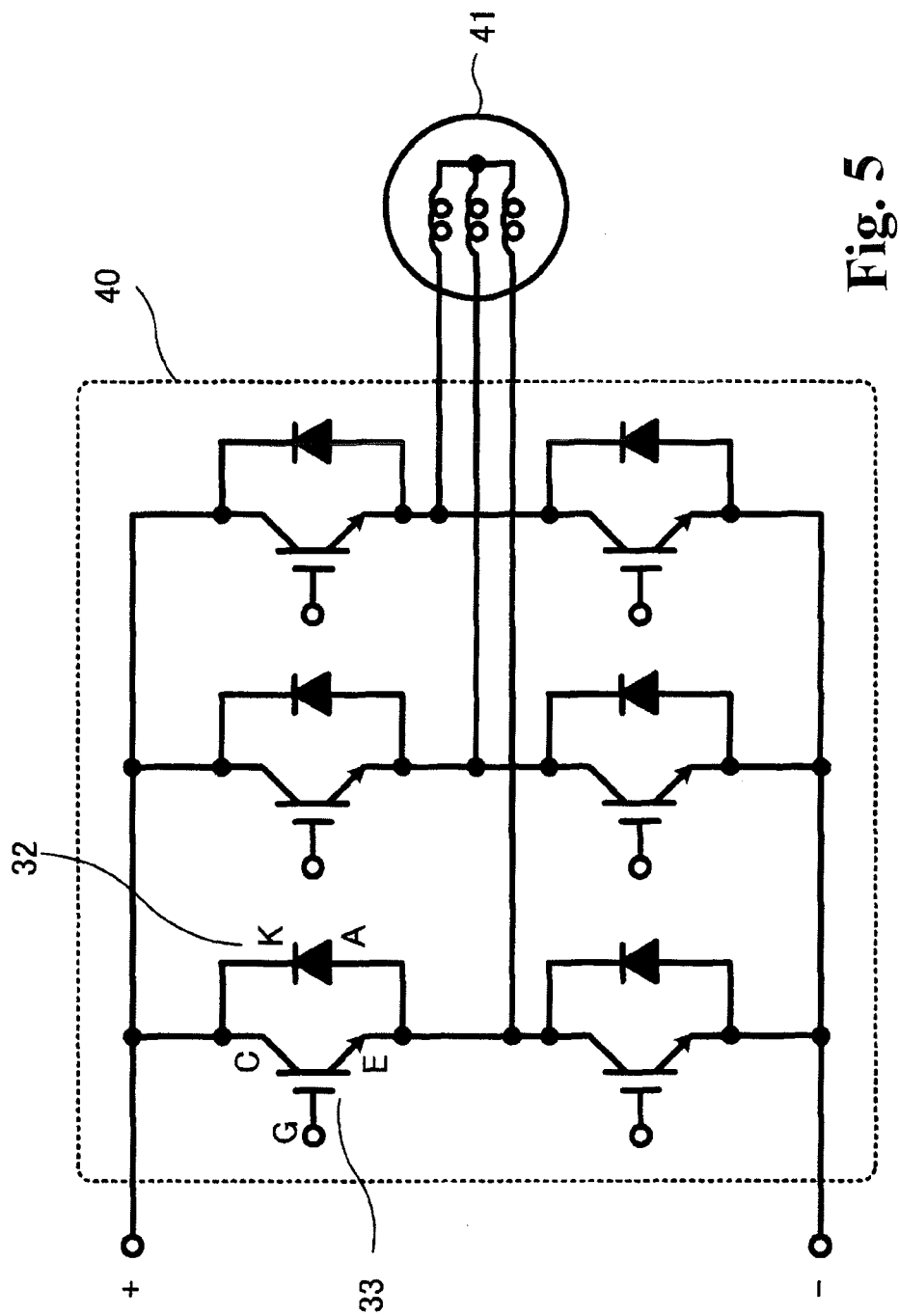
FIG. 5 is a diagram showing one example of a power converter circuit configured as the semiconductor module.

FIG. 5 is a diagram showing one example of a power converter circuit configured as the semiconductor module.

As these kinds of semiconductor device 32 and 33 mounted on the board 31, power semiconductor devices are used here. As one example, a free wheeling diode (FWD) can be used as one semiconductor device 32, and an insulated gate bipolar transistor (IGBT) can be used as the other semiconductor device 33, as shown in FIG. 5.

As the semiconductor module 10, it is possible to configure an inverter circuit 40 of, for example, three circuit element portions 3A to 3C.

FIG. 5 illustrates the inverter circuit 40 which converts direct current into alternating current and supplies it to a three-phase alternating current motor 41. The inverter circuit 40 includes a bridge circuit of the semiconductor device 33, which is the IGBT, and the semiconductor device 32, which is the FWD, for each of three phases, a U phase, V phase, and a W phase. The inverter circuit 40, by carrying out a switching control of the semiconductor device 33, can convert direct current into alternating current and drive the three-phase alternating current motor 41.

Herein, the circuit element portions 3A to 3C having the heretofore described kind of configuration are disposed on the fin base 2B of the cooler 2. The circuit element portions 3A to 3C can be connected so as to configure the inverter circuit, for example, on the cooler 2.

Now, when this kind of power converter circuit is in operation, heat generated in each circuit element portion 3A to 3C is conducted to the fin base 2B to which they are connected, and is further conducted to the fins 2C below the fin base 2B. As the fins 2C are disposed in the cooling flow paths 23, as heretofore described, the fins 2C are cooled by the refrigerant being circulated through the cooling flow paths 23. The circuit element portions 3A to 3C which generate heat are cooled by the cooler 2 in this way.

The above description has illustrated a case in which the number of circuit element portions 3A to 3C of the semiconductor module 10 is taken to be three. However, the number of circuit element portions is not necessarily limited to three, as in semiconductor modules to be shown next in FIGS. 6(A), 6(B) and the like as comparison examples.

Comparison Examples

Figure 6A:
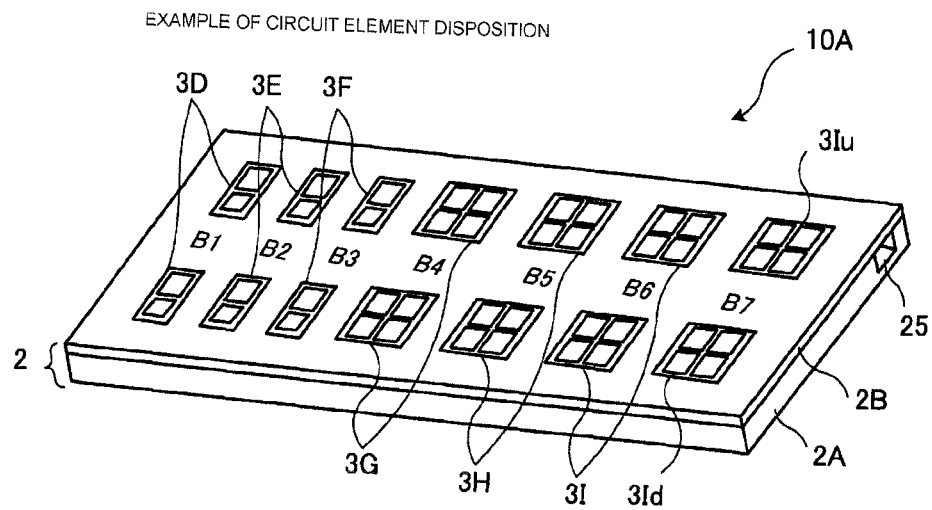
Figure 6B:
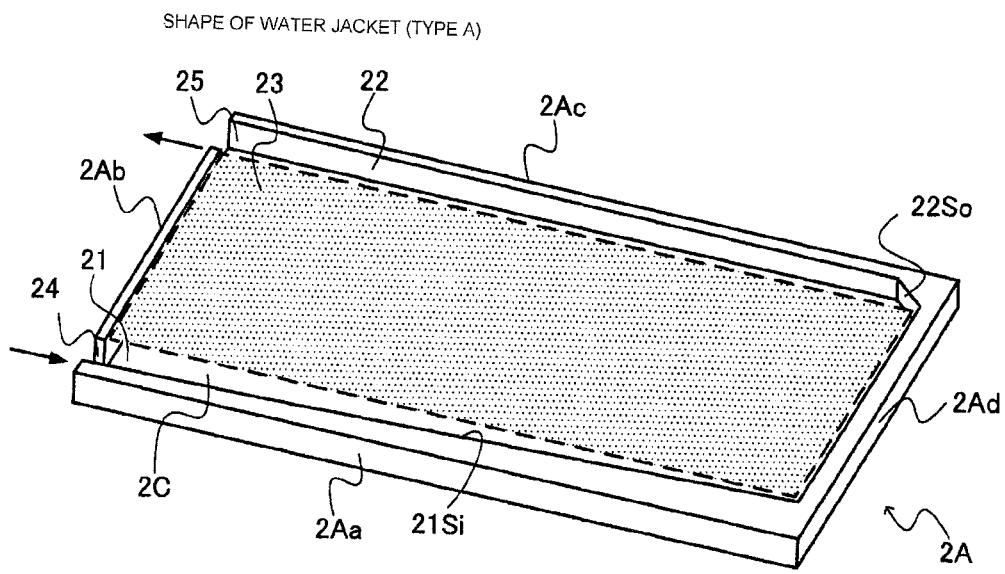

FIGS. 6(A), 6(B) are diagrams illustrating a heretofore known semiconductor module as a first comparison example, wherein FIG. 6(A) is a perspective view showing an example of disposition of circuit elements, and FIG. 6(B) is a perspective view showing a main portion configuration of a water jacket (type A) of the cooler.

In a semiconductor module 10A shown in FIG. 6(A), a total of 14 circuit element portions 3D to 3I, 3Iu, and 3Id are disposed in seven columns (B1 to B7) in the longer direction of the cooler 2 and in two rows in the short direction. The circuit element portions 3D to 3I, 3Iu, and 3Id, by being appropriately combined, can be connected so as to configure the kind of plurality of inverter circuits 40 shown in, for example, FIG. 5.

In a water jacket 2A of type A shown in FIG. 6(B), the refrigerant inlet flow path 21, the refrigerant outlet flow path 22, and the cooling flow paths 23 in the rectangular region shown by the broken line are provided on one principal surface side, and of these, the cooling flow paths 23 are formed to a size corresponding to the fins 2C. The fins 2C are integrated with the fin base 2B, and the fin 2C side is disposed turned to face the water jacket 2A, as shown in, for example, FIG. 2. Further, the fin base 2B integrated with the fins 2C are eventually disposed inside the water jacket 2A, as shown in FIGS. 1 and 2.

The fin base 2B and water jacket 2A are joined using, for example, an appropriate seal material (not shown). By so doing, the cooler 2 including the water jacket 2A, fin base 2B, and fins 2C can be configured. Herein, the guide portions 21Si and 22So having an inclination of 60° or less are formed respectively in the terminating portion of the refrigerant inlet flow path 21 into which the refrigerant flows from the inlet 24 and in the beginning portion of the refrigerant outlet flow path 22 which causes the refrigerant to flow out to the outlet 25. The guide portion 21Si has a uniform inclined surface all over a region opposite to the cooling flow paths 23.

Figure 7A:
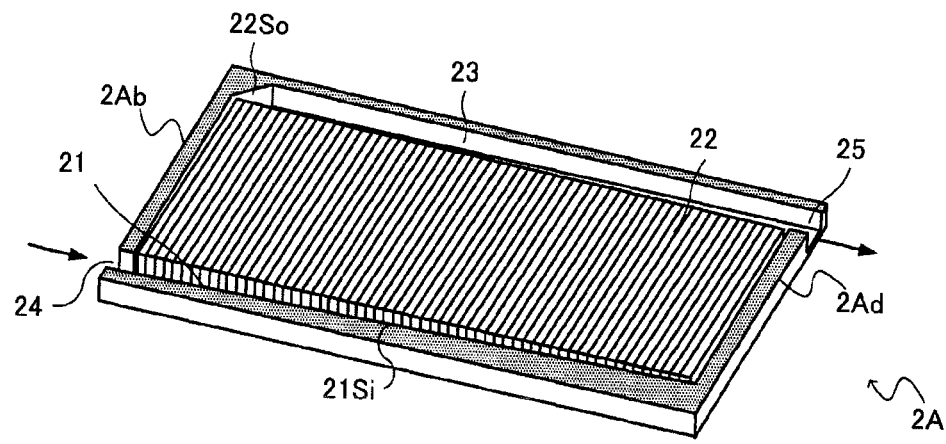
FIGS. 7(A), 7(B) are perspective views showing, as second and third comparison examples, shapes of water jackets of types different from that of the cooler in FIG. 6(B).
Figure 7B:
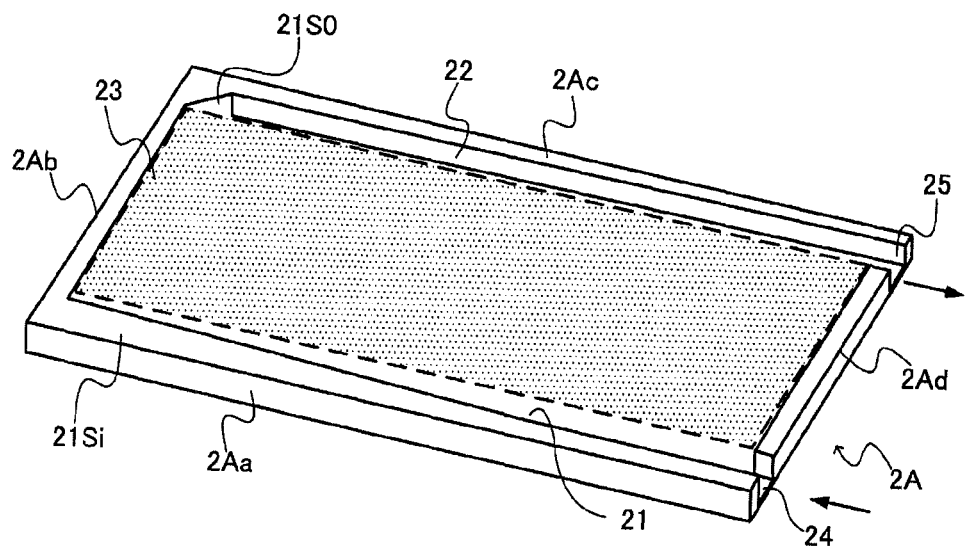

FIGS. 7(A), 7(B) are perspective views showing, as second and third comparison examples, shapes of water jackets of types different from that of the cooler in FIG. 6(B).

FIG. 6(B) shows the type A wherein the inlet 24 and outlet 25 are disposed on the same surface side of the left sidewall 2Ab. However, because of a difference in the method of connecting pipes which feed in and discharge the refrigerant, types with a plurality of shapes are used, such as a type B shown in FIG. 7(A) wherein the inlet 24 and outlet 25 are disposed in respective extreme opposite positions on the corresponding mutually opposing left and right sidewalls 2Ab and 2Ad, or a type C shown in FIG. 7(B) wherein the inlet 24 and outlet 25 are disposed in only the right sidewall 2Ad. Because of this, with the water jackets 2A to be actually used, it is necessary to optimize the shape of the refrigerant flow paths for each of the shapes of the water jackets 2A.

Figures 8A, 8B:
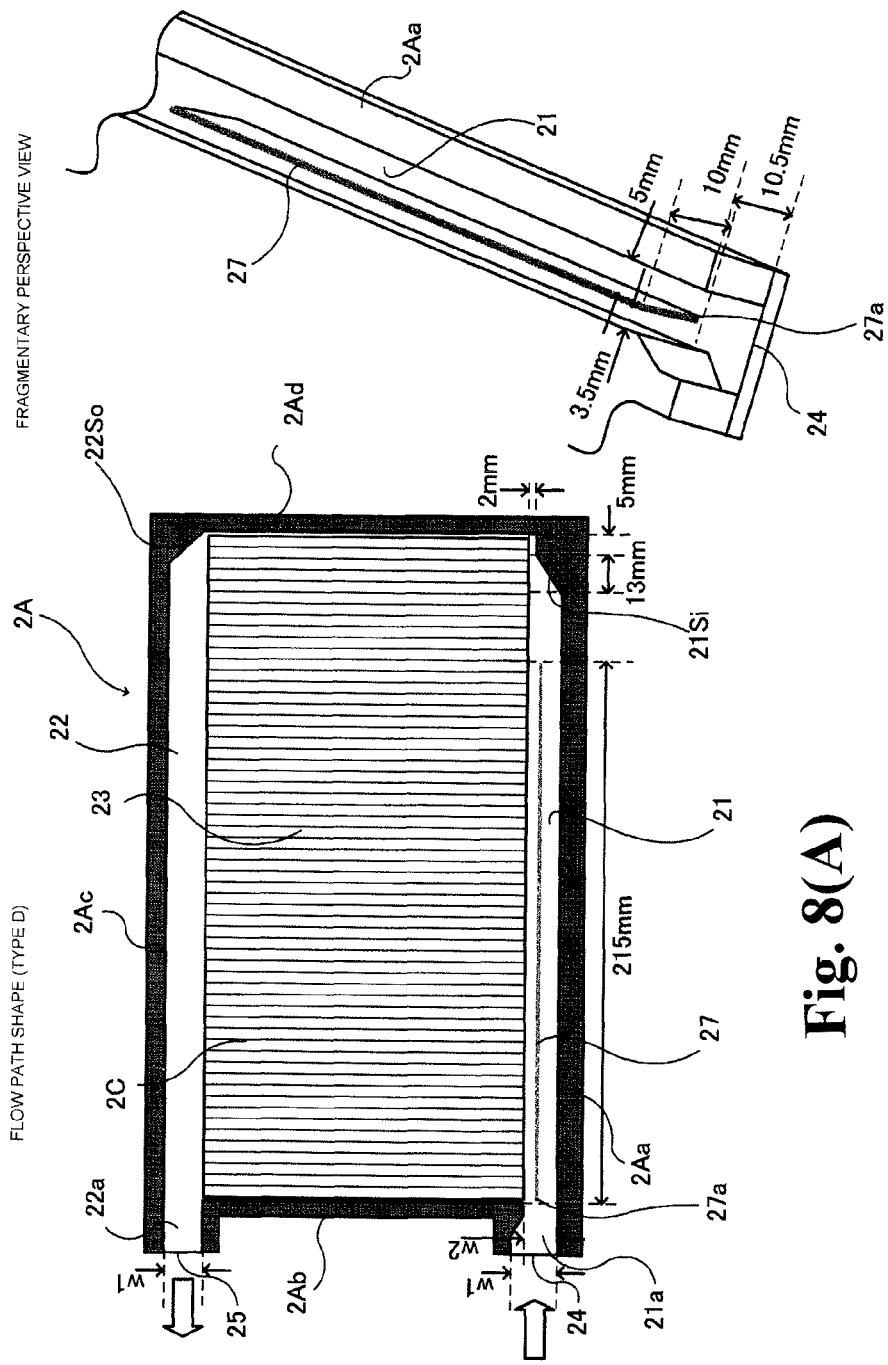

Also, FIGS. 8(A), 8(B) are diagrams illustrating a heretofore known semiconductor module as a fourth comparison example, wherein FIG. 8(A) is a plan view showing a shape of a water jacket, and FIG. 8(B) is a fragmentary perspective view thereof.

FIG. 8(A) shows a water jacket of an improvement example (a type D) wherein, in the water jacket of type A shown in FIG. 6(B), as well as the width of the inlet 24 thereof being changed, a separation wall 27 is installed in the refrigerant inlet flow path 21.

That is, in the water jacket 2A of type D, a section of the inlet portion 21a which feeds the refrigerant into the refrigerant inlet flow path 21 is formed in a tapered shape, and the flow path width of the inlet portion 21a is changed so that a flow path width w2 of the beginning portion of the refrigerant inlet flow path 21 is smaller than a flow path width w1 of the inlet 24. Also, the water jacket 2A of type D is such that the guide portion 21Si having a 13 mm long inclined portion and a 5 mm long flat portion is disposed in the terminating portion of the refrigerant inlet flow path 21. Furthermore, the separation wall 27 is formed in the refrigerant inlet flow path 21 so as to divide the flow path into two from the beginning portion. The separation wall 27 is disposed parallel to a refrigerant inflow-side side surface of the fins 2C in the cooling flow paths 23.

Herein, the separation wall 27 disposed in the refrigerant inlet flow path 21, having an overall length of 215 mm in the refrigerant inlet flow path 21, is provided so as to divide the flow path formed to a width of 10 mm into two flow paths, one with a width of 3.5 mm on the fin 2C side and the other with a width of 5 mm on the front sidewall 2Aa side. An upstream side leading end portion 27a of the separation wall 27 is positioned at a boundary portion between the refrigerant inlet flow path 21 and inlet portion 21a.

By forming the separation wall 27 in this way, it is possible not only to increase the flow velocity of the refrigerant flowing in from the inlet 24, but to increase the flow rate of the refrigerant flowing into the fins 2C opposite to the leading end portion 27a of the separation wall 27. Because of this, the flow velocity of the refrigerant heading toward the terminating portion in the refrigerant inlet flow path 21 increases, and it is also possible to enhance the effect of cooling the circuit element portions 3D (refer to FIG. 6(A)) disposed in the position of the leading end portion 27a of the separation wall 27.

That is, by improving the flow velocity of the refrigerant heading toward the terminating portion of the refrigerant inlet flow path 21 in the refrigerant inlet flow path 21, it is possible to appropriately improve the cooling performance of the cooler 2 in response to losses incurred in the circuit element portions 3D to 3I, 3Iu, and 3Id disposed in the semiconductor module shown in FIG. 6(A).

Figure 9:
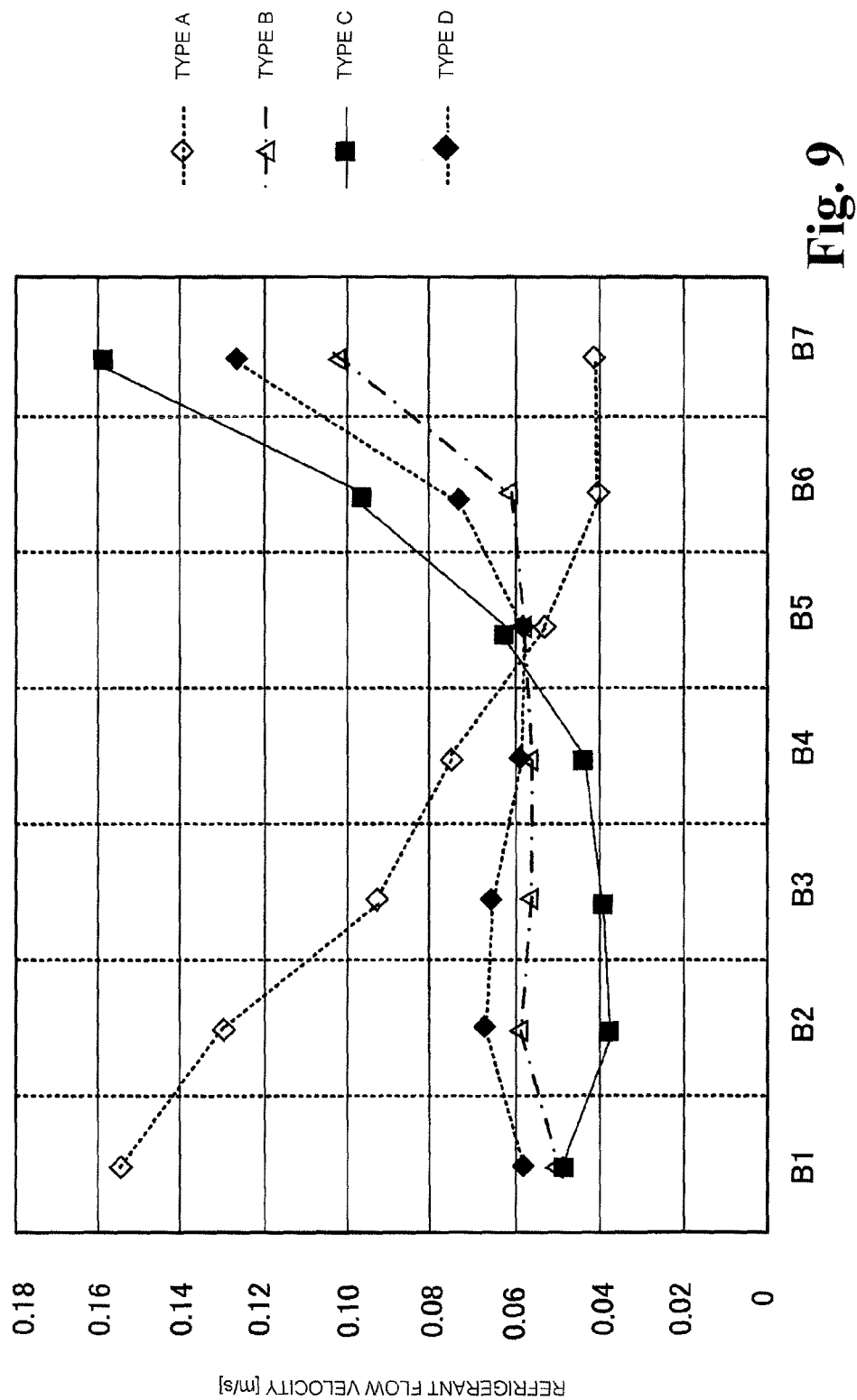
FIG. 9, showing cooling characteristics of the water jackets of FIGS. 6(B) to 8(A), is a diagram showing for each type a refrigerant flow rate distribution per circuit board position.
Figure 10:
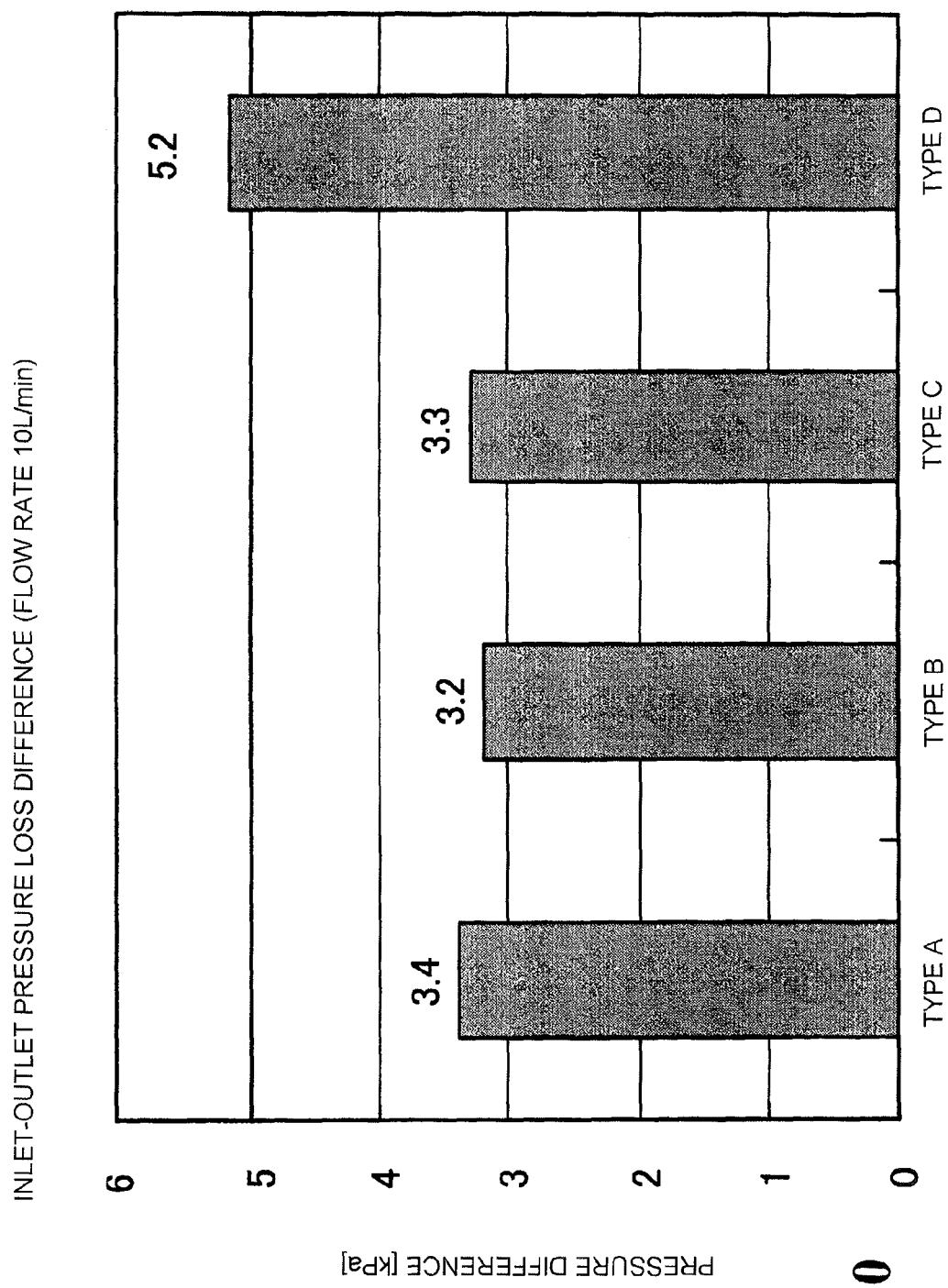
FIG. 10 is a diagram showing for each type a pressure loss difference between an inlet and an outlet when the refrigerant is caused to flow through the semiconductor modules of FIGS. 6(A) to 8(B).

FIG. 9, showing cooling characteristics of the water jackets of FIGS. 6(B) to 8(A), is a diagram showing for each type a refrigerant flow velocity distribution per circuit board position. FIG. 10 is a diagram showing for each type a pressure loss difference between at the inlet and at the outlet when the refrigerant is caused to flow through the semiconductor module of each FIGS. 6(B) to 8(A).

The graphs of FIG. 9 each show, for each circuit board position (B1 to B7), the flow velocity of the refrigerant flowing between the blade fins 2Ca when the blade fins 2Ca shown in FIG. 4(A) as one example are disposed in the cooling flow paths 23, and a refrigerant with a flow rate of 10 L/min is caused to flow from the inlet 24.

As can be seen from these graphs, the water jacket 2A of each type (A to D) has urged flow characteristics wherein the flow velocity distribution of the refrigerant flowing to the circuit board positions B1 to B7 for each of the flow path shapes of the water jackets 2A is uneven. For example, with the water jacket 2A of type A or type C wherein both the inlet 24 and outlet 25 are disposed on the same surface side, the refrigerant flow velocity is high on the B1 or B7 side on which a pipe is connected, 0.15 m/s or more on both sides. On the other hand, with the kind of water jacket 2A of type B wherein the inlet 24 and outlet 25 are disposed in diagonally opposite positions, the refrigerant flow rate is highest (0.10 m/s) in the circuit board position B7 on the outlet 25 side.

In this way, the refrigerant in the cooling flow paths 23 has biased flow characteristics wherein the flow velocity on the outlet 25 side, of parallel flow paths formed by the blade fins 2Ca between the refrigerant inlet flow path 21 and refrigerant outlet flow path 22, is significantly high. Also, with the type D improved on the type A, it can be seen that it is not only that the refrigerant flow velocity on the inlet 24 side is also improved, but it is possible to form a flow velocity distribution (biased flow characteristics) similar to that (those) of the type B wherein the inlet 24 and outlet 25 are disposed in the diagonally opposite positions.

Also, the pressure loss difference graphs shown in FIG. 10 show substantially the same pressure loss difference (3.2 to 3.4 kPa) in the water jackets 2A of types A to C before being improved. As opposed to this, with the water jacket 2A of type D wherein the width of the refrigerant inlet flow path 21 is reduced to ⅔, and the separation wall 27 is disposed therein, the pressure loss difference increases by 30% to 5.2 kPa.

Next, a description will be given of a disposition of the circuit element portions 3D to 3I, 3Iu, and 3Id cooled by the cooler 2.

As shown in FIG. 6(A), in the heretofore known semiconductor module 10A, a differently configured one can be disposed in the seventh column on the cooler 2, as the two circuit element portions 3Iu and 3Id, apart from the two rows and six columns of 12 circuit element portions 3D to 3I. At this time, the 12 circuit element portions 3D to 3I, by being appropriately combined, can be connected so as to configure the kind of plurality of inverter circuits 40 illustrated in, for example, FIG. 5. Also, the circuit element portions 3Iu and 3Id can be configured as, for example, a boost converter circuit using a predetermined number of IGBTs and FWDs.

In this kind of case, for example, the circuit element portions 3Iu and 3Id of the boost converter circuit are connected to a battery and the heretofore described inverter circuits 40, and the voltage of the battery is boosted by the circuit element portions 3Iu and 3Id. Further, it is possible to adopt a kind of circuit configuration wherein the boosted direct current is converted into alternating current by the inverter circuits 40 and supplied to the three-phase alternating current motor 41. In order to newly add circuit element portions 3Iu and 3Id different in type from these kinds of circuit element portion 3D to 3I, it is comparatively easy to dispose the circuit element portions 3Iu and 3Id in an end portion of the semiconductor module 10A, as shown in FIG. 6(A), when taking into consideration a wiring layout or the like in circuit design or manufacturing.

Also, the semiconductor module 10A is such that two heat generation portions exist inside the fins 2C in a direction of circulation of the refrigerant flowing through the cooling flow paths 23 of the cooler 2. That is, the two heat generation portions are positioned separated into the upstream side and downstream side in a direction in which the refrigerant flows. Consequently, the refrigerant flowing on the downstream side reaches the downstream side heat generation portion with the temperature thereof already raised by heat absorption in the upstream side heat generation portion. Because of this, the efficiency of cooling the circuit element portions disposed on the upstream side becomes higher than that on the downstream side. When considering this kind of difference in cooling efficiency, ones of the circuit element portions 3D to 3I, with a larger amount of heat generated when they are driven, are disposed on the refrigerant inlet flow path 21 side, thereby enabling easier cooling.

Furthermore, the flow velocity distribution of the refrigerant flowing through the cooling flow paths 23 of the cooler 2 has the heretofore described kinds of biased flow characteristic wherein the refrigerant flow velocity increases more in a position close to the outlet 25 than on the inlet 24 side. Moreover, the cooling efficiency of the fins 2C becomes higher in a high flow velocity portion in which the refrigerant flows quickly through the cooling flow paths 23. Consequently, it is required that the refrigerant is circulated through the cooling flow paths 23 of the semiconductor module 10A at a certain flow velocity or more in accordance with the amount of heat generated in the circuit element portions 3D to 3I, 3Iu, and 3Id. However, simply by increasing the flow rate of the refrigerant from the inlet 24 for the purpose of increasing the flow velocity in a low flow velocity portion, more refrigerant than necessary flows to the high flow velocity portion of the cooling flow paths 23. As a result of this, there arises a need to increase the refrigerant flow rate supplied to the cooler 2, because of which a pump with high performance has to be prepared.

In general, thermofluid analyses including physical phenomena such as a refrigerant flow, heat conduction, and heat transfer are necessary in order to simulate the flow path characteristics of the cooling flow paths 23 of this kind of semiconductor module 10A. Also, when calculating an increase in the temperature of the refrigerant due to heat generation in the circuit element portions 3D to 3I, 3Iu, and 3Id, it is possible to obtain results of the analyses by giving a pressure loss incurred in a steady operation condition.

Therefore, when a refrigerant flow velocity distribution is simulated using the water jacket 2A of each heretofore known type A to C shown in FIGS. 6(B)-7(B), the refrigerant fed into the water jacket 2A from the inlet 24 flows so as to be drawn to the position of the outlet 25. Because of this, the refrigerant flowing into the cooling flow paths 23 flows comparatively quickly particularly on the side close to the refrigerant outlet 25, as shown in the refrigerant flow velocity distribution diagram of FIG. 9.

Also, in the plurality of disposed circuit element portions 3D to 3I, 3Iu, and 3Id, in general, it is required to maintain refrigerant flow velocities necessary to cool the semiconductor devices 32 and 33 in accordance with incurred pressure losses. However, when the refrigerant flow velocities differ greatly from each other due to the heretofore described kinds of biased flow characteristic, the cooling performance is also of an uneven distribution in the same way. Above all, in the cooling flow paths 23, a change in cooling performance is more obtuse than a flow velocity fluctuation on the outlet 25 side on which the flow velocity is high, while a change in cooling performance is greater on the inlet 24 side on which the flow velocity is likely to be low. This means that a flow velocity component for which it is difficult to contribute to an improvement in cooling performance occurs on the outlet 25 side.

Therefore, in the event that as uniform a refrigerant flow velocity as possible can be obtained by improving these kinds of urged flow characteristic of the cooling flow paths 23, it is not only possible to obtain more stable cooling performance, but it is possible to improve the overall cooling performance of the cooler 2 which cools the circuit element portions 3D to 3I, 3Iu, and 3Id.

Also, the biased flow characteristics of the refrigerant are a phenomenon occurring in parallel flow paths in the cooling flow paths 23 sandwiched between the refrigerant inlet flow path 21 and refrigerant outlet flow path 22. In particular, when the intervals between the cooling fins 2C disposed in the cooling flow paths 23 are increased, resistance against the refrigerant flowing from the refrigerant inlet flow path 21 to the fins 2C decreases, and it becomes easier for the refrigerant to flow into the cooling flow paths 23. Consequently, the fins 2C in the cooling flow paths 23 are such that the wider the intervals therebetween they have a shape with, the more the biased flow characteristics are extended.

With the types A to C shown in FIGS. 6(B)-7(B), as their biased flow characteristics differ from each other, as heretofore described, methods of cooling uniformly and stably differ according to the pressure loss distributions in the cooling flow paths 23 differing for each of the circuit element portions 3D to 3I, 3Iu, and 3Id disposed on the fin base 2B.

Each following embodiment describes a semiconductor module cooler improved so as to adjust the flow velocity distribution of a semiconductor module with the inlet 24 and outlet 25 disposed on the same surface side, as in the heretofore known water jacket 2A of type A shown in FIG. 6(B). The cooling efficiencies of the semiconductor module coolers are all based on the flow velocity distribution verified by the heretofore described simulation on the premise of the nature (refrigerant properties) and cooling performance of the refrigerant itself.

First Embodiment

Herein, a description will be given of the cooler 2 wherein a flow velocity adjustment plate 28 is disposed in a boundary position between the refrigerant outlet flow path 22 and cooling flow paths 23 in order to adjust a biased flow in the semiconductor module.

Figure 11:
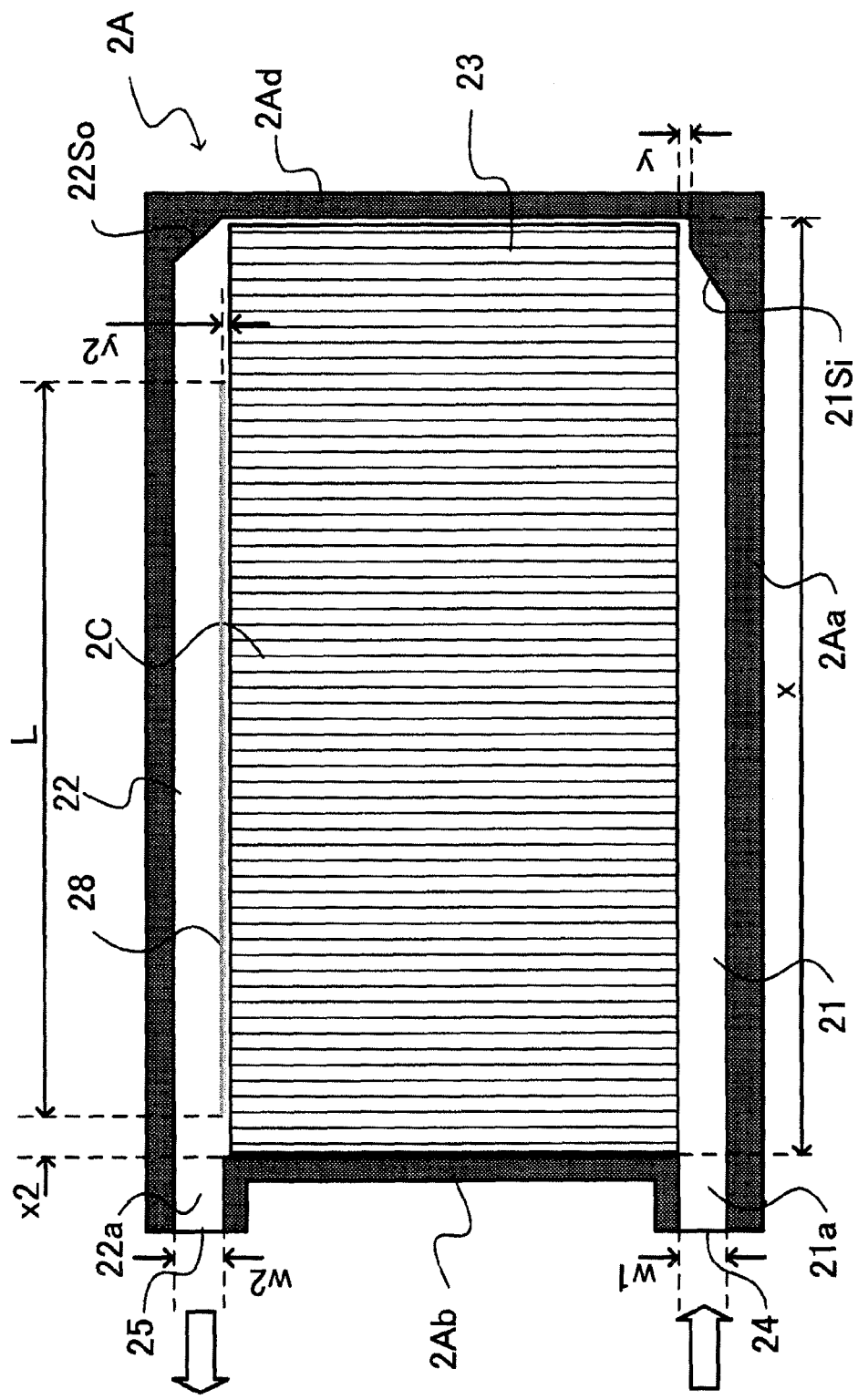
FIG. 11 is a plan view showing a shape of a water jacket used in a semiconductor module cooler of the invention.

FIG. 11 is a plan view showing a shape of a water jacket used in the semiconductor module cooler of the invention.

A water jacket 2A of type Fc shown here is used in the cooler 2 of the semiconductor module 10A in FIG. 6(A). Consequently, in the water jacket 2A of type Fc, the inlet 24 and outlet 25 are disposed in the left sidewall 2Ab, in the same way as in the heretofore known type A shown in FIG. 6(B). However, the inlet portion 21a which feeds the refrigerant into the refrigerant inlet flow path 21 from the inlet 24 and the outlet portion 22a for causing the refrigerant to flow out from the refrigerant outlet flow path 22 to the outlet 25 are formed so as to be long compared with those shown in FIG. 6(B) or FIG. 3. That is, the inlet portion 21a and outlet portion 22a are both formed so as to protrude from the same left sidewall 2Ab.

Also, in the water jacket 2A of type Fc, the inlet portion 21a and outlet portion 22a are formed to a width equal to that of the inlet 24 and outlet 25 (W1=W2), for example, the same 15 mm width. The refrigerant inlet flow path 21, being 255.2 mm in length x, has in the terminating portion thereof the guide portion 21Si with an approximately 45° inclined surface formed on the inner surface side of the front sidewall 2Aa opposite to the front-side side surface (refrigerant inflow surface) of the fins 2C disposed in the cooling flow paths 23. A clearance y between the guide portion 21Si in the terminating portion of the refrigerant inlet flow path 21 and the fins 2C is 2 mm, as in the water jacket 2A of type D (FIG. 8(A)).

Herein, in the water jacket 2A of type Fc, the flow velocity adjustment plate 28 is disposed in the boundary position between the refrigerant outlet flow path 22 and cooling flow paths 23. The flow velocity adjustment plate 28 is formed in a shape with an overall length L (–215 mm), a height h (=9.5 mm) from the bottom surface of the water jacket 2A, and a width (a thickness) of 3 mm. Also, a sidewall surface of the flow velocity adjustment plate 28 is disposed spaced a clearance y2 (=2 mm) from and parallel to the rear-side side surface (refrigerant outflow surface) of the fins 2C, and one end portion of the flow velocity adjustment plate 28 is disposed so as to form a clearance x2 (=5 mm) with the left sidewall 2Ab of the water jacket 2A.

Also, in the refrigerant outlet flow path 22, the guide portion 22So formed with an approximately 45° inclined surface, as in the guide portion 21Si of the refrigerant inlet flow path 21, is disposed in the right sidewall 2Ad side beginning portion. Herein, by the sidewall surface of the flow velocity adjustment plate 28 being formed parallel to the side surface of the fins 2C, it is possible to reduce the rate of an increase in pressure loss due to a decrease in flow path sectional area, and furthermore, by increasing the flow path width of the refrigerant outlet flow path 22, it is possible to obtain an excellent advantageous effect.

FIG. 12 is an illustration showing dimensions for each type of the flow velocity adjustment plate in the semiconductor module cooler of FIG. 11.

Herein, a description will be given of water jackets 2A of type E, type Ea, type Eb, type F, type Fa, and type Fb, other than the water jacket 2A of type Fc shown in FIG. 11. The water jacket 2A of any type is formed to a size such that the flow path widths (w1 and w2) of the refrigerant inlet flow path 21 and refrigerant outlet flow path 22 are both 15 mm equal to each other, the width of the cooling flow paths 23 is 255 mm, the length thereof is 117 mm, the clearance y between the guide portion 21Si and fins 2C is 2 mm, and the clearance y2 between the flow velocity adjustment plate 28 and fins 2C is 2 mm.

Also, the water jackets 2A of type E, type Ea, and type Eb are the same as each other in that L and x2 are 175 mm and 0 mm respectively, but differ from each other in that the height h of the flow velocity adjustment plate 28 varies within a range of from 9.5 mm to 5.5 mm. Also, in the same way, in the type F series too, x2 is set to 0 mm, and the height h of the flow velocity adjustment plate 28 is varied within a range of from 9.5 mm to 5.5 mm, but the types F, Fa, and Fb differ from each other in that the flow velocity adjustment plate 28 is formed with the length L thereof set to 215 mm so as to be longer than those of the type E series. Only the type Fc shown in FIG. 11 is different from all the other in that x2 is set to 5 mm rather than 0 mm.

By configuring the water jackets 2A wherein the length L of the flow velocity adjustment plate 28, the clearance y2 between the flow velocity adjustment plate 28 and fins 2C, and furthermore, the clearance x2 between the flow velocity adjustment plate 28 and flow path left sidewall 2Ab are changed based on the flow path shape of each type shown in FIG. 12, it is possible to suppress the flow velocity of the refrigerant heading toward the terminating portion in the refrigerant inlet flow path 21 to an appropriate level. This point will be described using the following FIGS. 13 and 14(A)-(C).

Even when the areas of the inlets 24 are the same, the flow velocity in the cooling flow paths 23 is improved due to the inlet portion 21a (refer to FIG. 8(A)) whose sectional area decreases continuously toward a direction in which the refrigerant is supplied.

Next, a description will be given of results of simulations of refrigerant flow velocities and cooling effects implemented on the water jackets 2A having various types of flow path shape shown in FIG. 12. Herein, a case is assumed in which the blade fins 2Ca with a thickness of 1.2 mm, a pitch of 2.1 mm, and a height of 10 mm are disposed in the cooling flow paths 23 formed in a 255 mm wide and 117 mm long region, and the refrigerant is fed into the refrigerant inlet flow path 21 from the inlet 24 at a flow rate of 10 L/min. Also, the effect of a difference in the length and position of the flow velocity adjustment plate 28 on the refrigerant flow velocity distribution or the like is confirmed by simulating the water jackets 2A of types different from each other.

Figure 13:
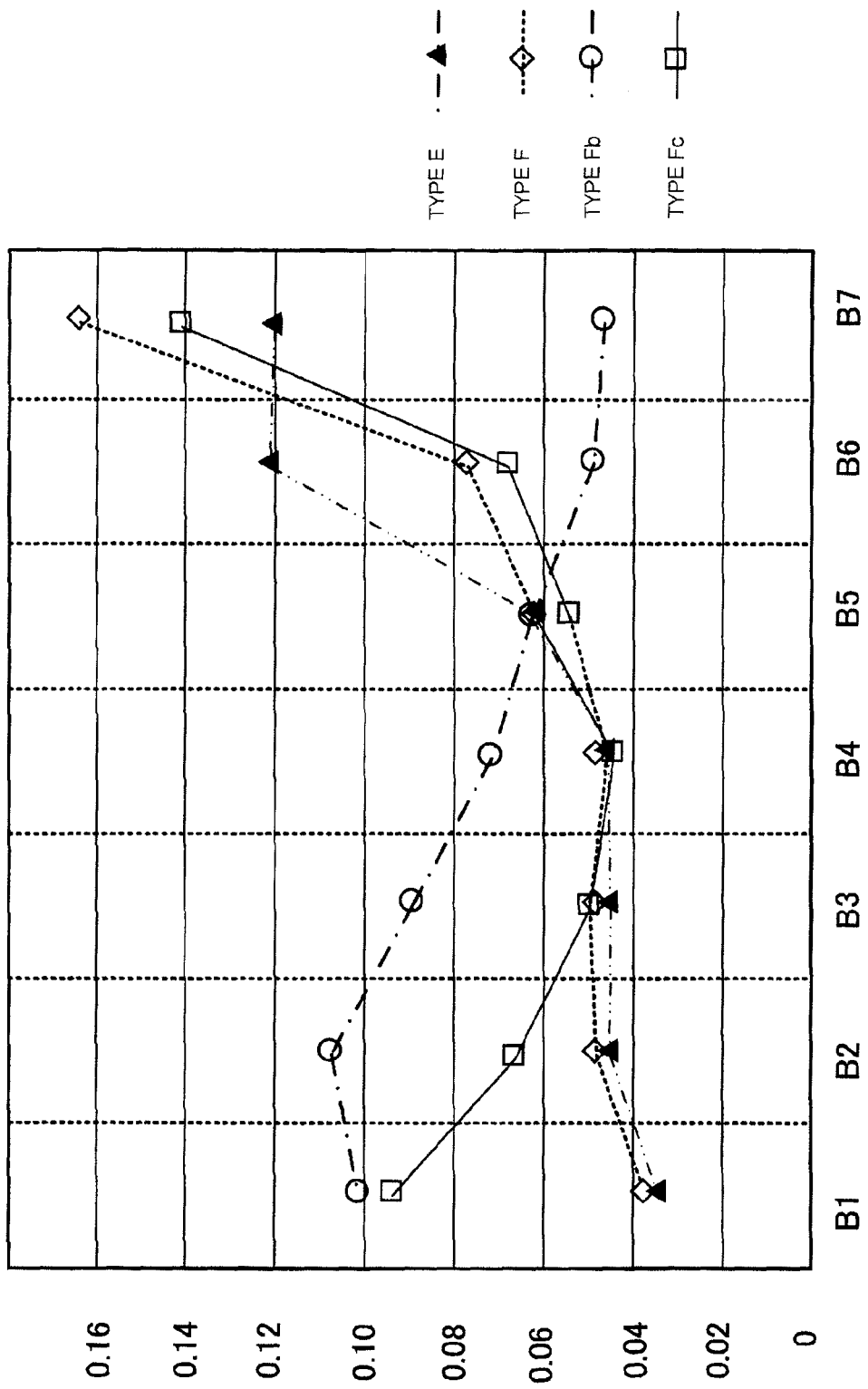
FIG. 13, showing cooling characteristics of the water jacket of FIG. 11, is a diagram showing for each type a refrigerant flow velocity distribution per circuit board position.

FIG. 13, showing cooling characteristics of the water jackets of FIG. 11, is a diagram showing for each type a refrigerant flow velocity distribution per circuit board position.

Each flow velocity distribution shown in FIG. 13 is a result of simulating the refrigerant flow velocity between the fins 2C disposed immediately below the central portion of the board of each circuit element portion 3D to 3I, 3Iu, and 3Id disposed in seven columns (positions B1 to B7). Herein, the flow velocities are shown in the order of B1 to B7 from the inlet 24 side toward the terminating portion of the refrigerant inlet flow path 21. Also, the refrigerant inlet flow paths 21 used in simulating the flow velocity distributions are all set to have an overall length of 255 m and a height of 10.5 mm.

According to the simulation results shown in FIG. 13, in the cases of the type E, type F, and type Fc wherein the heights of the flow velocity adjustment plates 28 are increased to 9.5 mm, their flow velocity distributions change greatly. Also, in the cases of the type E and type F wherein the heights of the flow velocity adjustment plates 28 are set to 9.5 mm, the flow velocity distributions depending on their lengths L are exhibited. That is, the type E is improved in flow velocity in the circuit board positions B6 and B7, and furthermore, the type F is improved in flow velocity particularly in the position B7, compared with the type Fb.

Because of this, the flow velocity of the refrigerant discharged from the fins 2C decreases due to pressure generated when the refrigerant smashes against the flow velocity adjustment plate 28, meaning that it is possible to adjust the flow velocity distribution. Also, when the clearance x2 (=5 mm) is provided between the outlet 25 side end portion of the flow velocity adjustment plate 28 and the left sidewall 2Ab of the water jacket 2A, as in the type Fc, the refrigerant flow velocity improves in the position B1, thereby forming the flow velocity distribution in the fins 2C into a U-shape. That is, this shows that it is possible to create an optional flow velocity distribution using the flow velocity adjustment plate 28 in the refrigerant outlet flow path 22, and that even a slight clearance in the order of 5 mm has a great effect on a flow velocity adjustment in the vicinity of the outlet 25 of the refrigerant outlet flow path 22.

From the above simulation results, conditions in which heat is generated by the power semiconductor devices corresponding to the refrigerant flow velocities in the circuit element portions 3D to 3I, 3Iu, and 3Id, that is, cooling characteristics can be confirmed for the water jacket 2A of each type shown in FIG. 12.

Figure 14A:
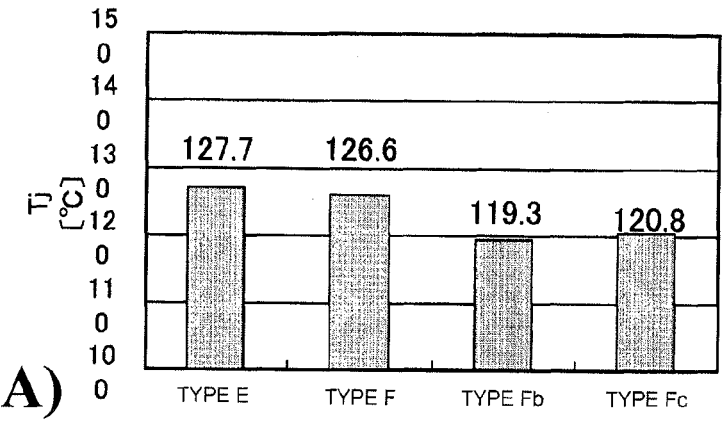
FIGS. 14(A)-14(C), showing cooling characteristics of the water jacket of FIG. 11, are diagrams showing for each type a temperature of heat generated at a steady operation time for each circuit element portion.
Figure 14B:
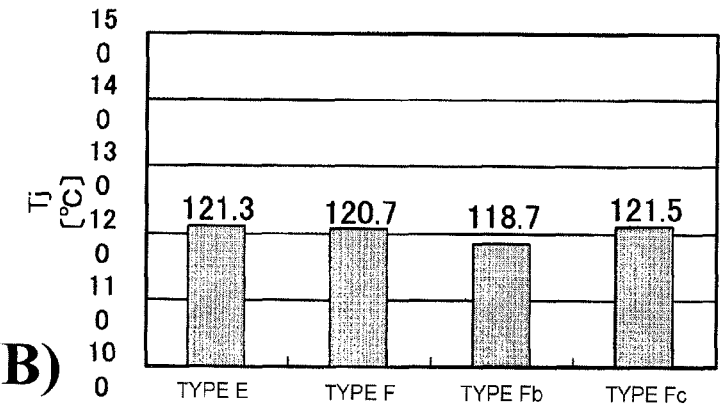
Figure 14C:
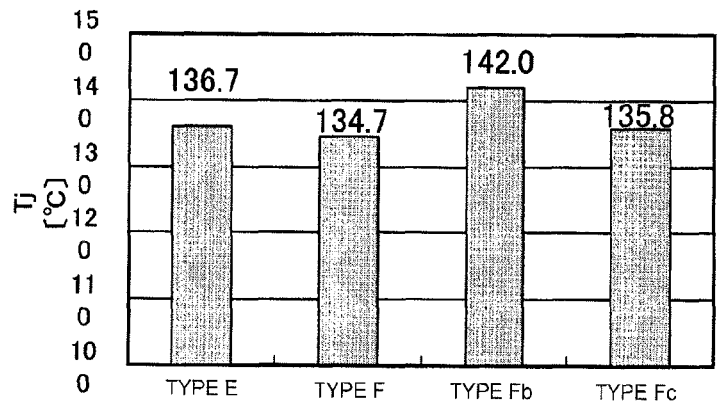

FIGS. 14(A)-14(C), showing cooling characteristics of the water jackets shown in FIG. 11, are diagrams showing for each type a temperature of heat generated at a steady operation time for each circuit element portion. FIGS. 14(A)-14(C) are examples of simulation results obtained by the previously described method.

A pressure loss incurred by the refrigerant in the water jacket 2A when cooling the circuit element portions 3D and the like differs for each type shown in FIG. 12. However, it is supposed that heat losses in the water jackets 2A are classified into two groups with three columns each from the inlet 24 side, the positions B1 to B3 of the circuit element portions 3D to 3F and the positions B4 to B6 of the circuit element portions 3G to 3I, as shown in FIG. 6(A) heretofore described, and can be set to the same size in the same group. Also, heat losses different between in the upstream side circuit element portion 3Id and in the downstream side circuit element portion 3Iu are set in the circuit element portions 3Iu and 3Id in the seventh column.

IGBT elements disposed one in each of the downstream side circuit element portion 3D in the first column (position B1) and circuit element portion 3G in the fourth column (position B4) are taken to be targets for comparison in generated heat temperature in FIGS. 14(A)-14(C). Also, in the seventh column (position B7), one (3Id), of the circuit element portions 3Iu and 3Id, with a greater incurred loss is taken to be a target for comparison. Furthermore, incurred loss values set one for each of the circuit element portions 3D to 3I, 3Iu, and 3Id in accordance with their respective generated heat amounts are set to a relationship of 3D<3G<3Iu<3Id based on the relationship between the refrigerant flow velocity and the refrigerant temperature and cooling performance.

As shown in FIG. 14(C), the junction temperature (Tj) of the circuit element portion 3Id is 136.7° C. in the type E, 134.7° C. in the type F, and 142.0° C. in the type Fb with the flow velocity distribution biased toward the outlet 25 side. Herein, the effect of a decrease in temperature by 5° C. or more can be seen depending on the length of the flow velocity adjustment plate 28. Also, as shown in FIGS. 14(A), 14(B), the junction temperature of each IGBT changes along with a change in flow velocity distribution on the downstream side in the B1 column and the downstream side in the B4 column. However, this shows that it is possible to obtain stable cooling performance in each longitudinal column (B1 to B7) of the cooler 2 by adjusting the length of the flow velocity adjustment plate 28 so as to form a flow velocity distribution proportionate to a loss incurred in each circuit element portion 3D to 3I, 3Iu, and 3Id.

In this way, with the water jacket 2A used in the semiconductor module of the invention, it is possible to reduce the junction temperature of the power semiconductor devices by disposing the flow velocity adjustment plate 28 in the boundary position between the refrigerant outlet flow path 22 and cooling flow paths 23. In particular, the effect of the flow velocity having improved immediately below the central portion of the board of the circuit element portion 3Id with a high incurred loss (in the position B7) is great.

Figure 15:
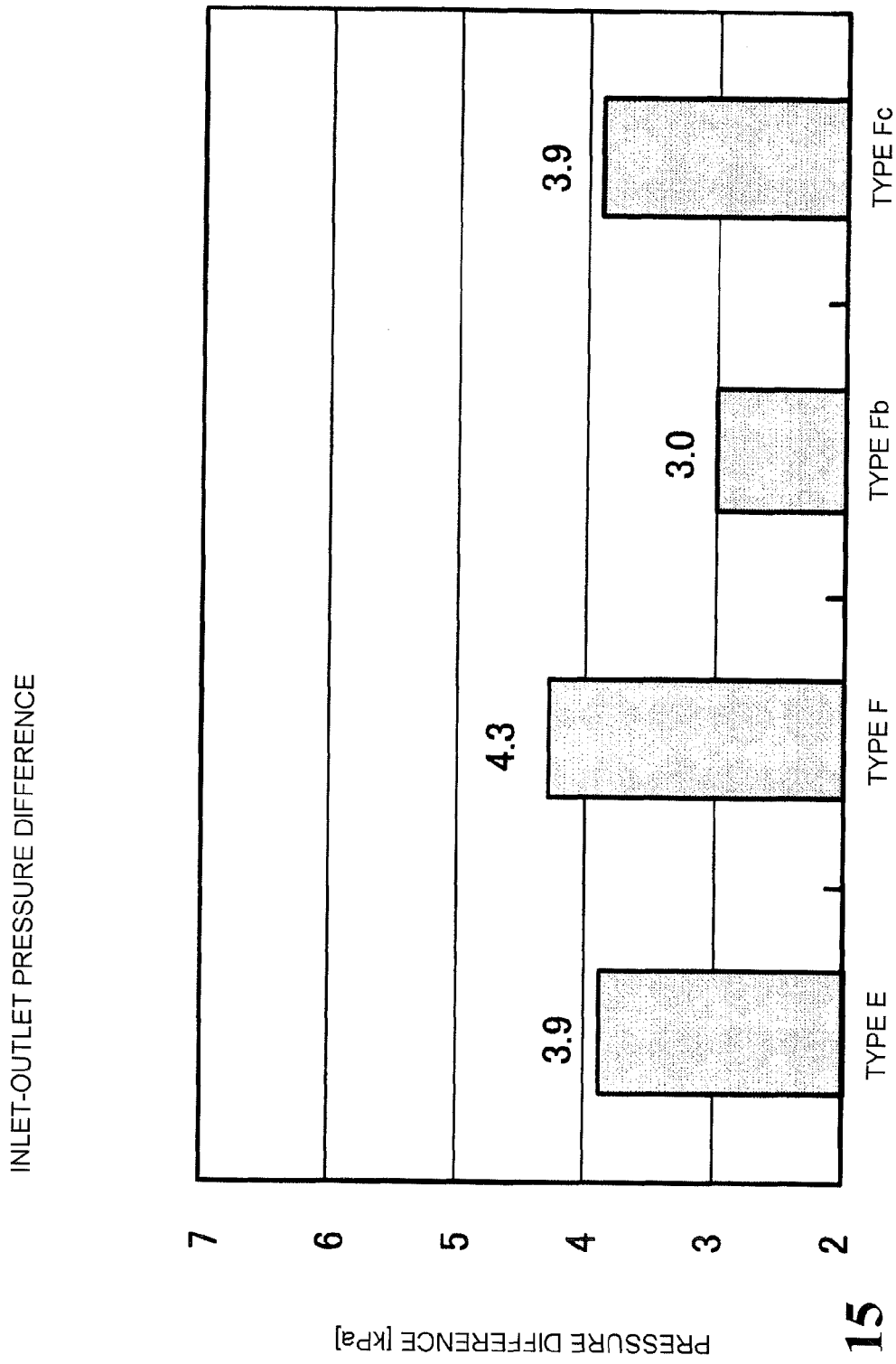
FIG. 15 is a diagram showing for each type a pressure loss difference between the inlet and the outlet when the refrigerant is caused to flow through the semiconductor module of FIG. 11.

FIG. 15 is a diagram showing for each type a pressure loss difference between at the inlet and at the outlet when the refrigerant is caused to flow into the semiconductor module of FIG. 11. According to the simulation results shown in FIG. 15, all the differences show a value less than 4.5 kPa. This shows that the pressure losses are low, and moreover, the flow velocities roughly coincide with each other, even when compared with the improvement example (type D) on the refrigerant inlet flow path 21 side, as in the fourth comparison example shown in FIG. 8(A). By disposing the flow velocity adjustment plate 28 which carries out a flow adjustment on the refrigerant outlet flow path 22 side in this way, it is possible to reduce the pressure loss, and thus possible to reduce a load on a pump.

In the water jacket 2A in this embodiment, the refrigerant inlet flow path 21 is defined by the inner surface of the bottom wall 2Ae of the water jacket 2A and the front-side side surface of the fins 2C configuring the heat sink, and the refrigerant outlet flow path 22 is defined by the inner surface of the bottom wall 2Ae and the rear-side side surface of the fins 2C. Further, a biased flow occurring in the refrigerant flow velocity in the fins 2C can be resolved in such a way that the flow velocity adjustment plate 28 is disposed in the refrigerant outlet flow path 22, and the flow velocity of the refrigerant flowing into the fins 2C from the refrigerant inlet flow path 21 is appropriately adjusted by pressure generated when the refrigerant flowing out from the fins 2C collides against the flow velocity adjustment plate 28. By so doing, it is possible to uniformly and stably cool the semiconductor devices disposed on the cooler 2, and thus possible to reliably prevent malfunction and breakage due to heat generation of the semiconductor devices.

Also, in the water jacket 2A of the first embodiment, the inlet 24 and outlet 25 are disposed in the same surface of the water jacket 2A, and it is possible to configure a flow path shape so as to obtain cooling performance corresponding to the loss incurred in each different circuit element portion 3D to 3I, 3Iu, and 3Id. Above all, it is possible to inexpensively and easily manufacture the water jacket 2A wherein the length from the inlet 24 to the outlet 25 is shorter.

Also, it is possible to produce a greater flow velocity adjustment effect not only by disposing the flow velocity adjustment plate 28 in the refrigerant outlet flow path 22, but further by adjusting the width of the heretofore known refrigerant inlet flow path 21, or by combining and using the kind of separation wall 27 of FIGS. 8(A), 8(B).

The fins 2C configuring the heat sink, the front-side side surface of which is substantially parallel to an inflow direction of the refrigerant flowing in from the inlet 24, are disposed in a position flush with the inner wall of the inlet portion 21a so as not to block the flow of the refrigerant in the refrigerant inlet flow path 21. Also, the interval from the bottom wall 2Ae of the water jacket 2A to the fin base 2B, which defines the height of the refrigerant inlet flow path 21, is constant.

Second Embodiment

Figure 16:
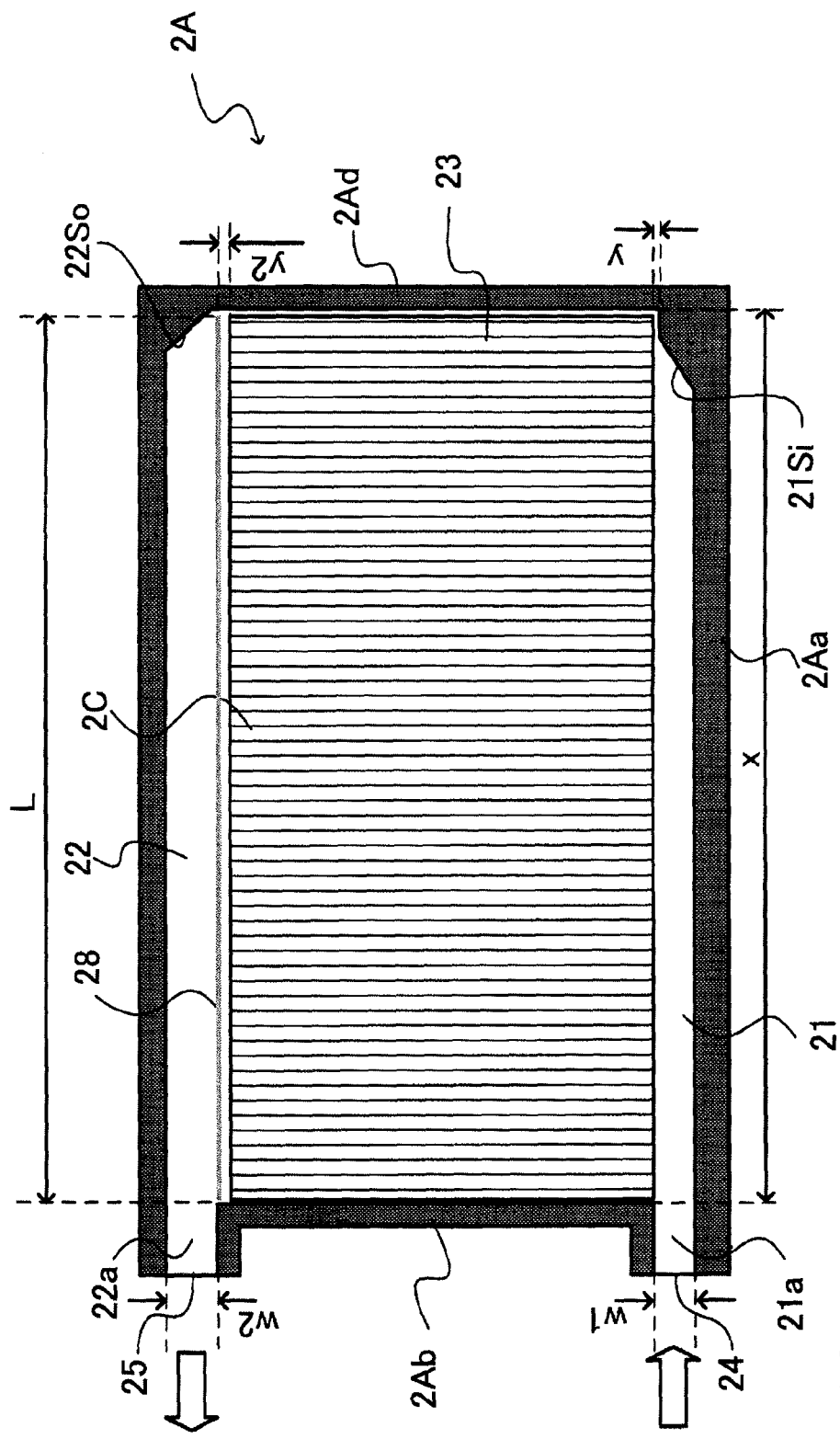
FIG. 16 is a plan view showing a shape of a water jacket used in another semiconductor module cooler of the invention.

FIG. 16 is a plan view showing a shape of a water jacket used in another semiconductor module cooler of the invention.

In this embodiment, a description will be given of a cooler arranged so as to adjust a biased flow in the semiconductor module, and uniformly and stably cool the semiconductor devices not simply by installing the flow velocity adjustment plate 28 in the refrigerant outlet flow path 22, but further by making the length of the flow velocity adjustment plate 28 the same as that of the refrigerant outlet flow path 22.

In the water jacket 2A of type G shown in FIG. 16, the inlet portion 21a which feeds the refrigerant into the refrigerant inlet flow path 21 from the inlet 24 and the outlet portion 22a for causing the refrigerant to flow out from the refrigerant outlet flow path 22 to the outlet 25 are formed protruding from the same left sidewall 2Ab of the water jacket 2A, in the same way as in the type D shown in FIG. 8(A), the type Fc shown in FIG. 11, and the like. Also, the water jacket 2A of type G is such that it is not only that the inlet 24 and outlet 25 of the cooler are formed on the same surface side, but the flow velocity adjustment plate 28 whose length is equal to the length x of the refrigerant outlet flow path 22 is disposed in the boundary position between the refrigerant outlet flow path 22 and cooling flow paths 23.

FIG. 17 is an illustration showing dimensions for each type of the flow velocity adjustment plate, and of the flow path widths of the inlet and outlet, in the semiconductor module cooler of FIG. 16. As shown in FIG. 17, the flow velocity adjustment plate 28 is formed in the refrigerant outlet flow path 22 of the type C so as to have an optional height not exceeding 8 mm vertically from the bottom wall 2Ae surface of the water jacket 2A. Also, the cooling flow paths 23 are configured between the 10 mm wide refrigerant inlet flow path 21 and 15 mm wide refrigerant outlet flow path 22. The dimensions of a type Ga, type Gb, type Gc, type H, and type I are shown here, apart from those of the type G.

The flow velocity of the refrigerant flowing through the cooling paths 23 takes on a flow velocity distribution depending on the position of the outlet 25 of the water jacket 2A, as previously described. Herein, furthermore, the flow velocity adjustment plate 28 with a length L of 255 mm and a width (thickness) of 3 mm is formed in the refrigerant outlet flow path 22 (that is, the clearance x2 between the flow velocity adjustment plate 28 and the left sidewall 2Ab of the water jacket 2A is 0 mm), and the flow velocity of the refrigerant discharged from the fins 2C is brought into uniformity and adjusted into a steady flow velocity distribution.

In this way, the water jacket 2A of type G differs from the type E series and type F series shown in FIG. 12 in that the length of the flow velocity adjustment plate 28 is set to be the same as the length x of the refrigerant outlet flow path 22 (that is, the width of the cooling flow paths 23), and the flow velocity adjustment plate 28 is connected to the left sidewall 2Ab (the refrigerant outlet 25 side sidewall of the cooling flow paths 23) of the water jacket 2A.

Figure 18A:
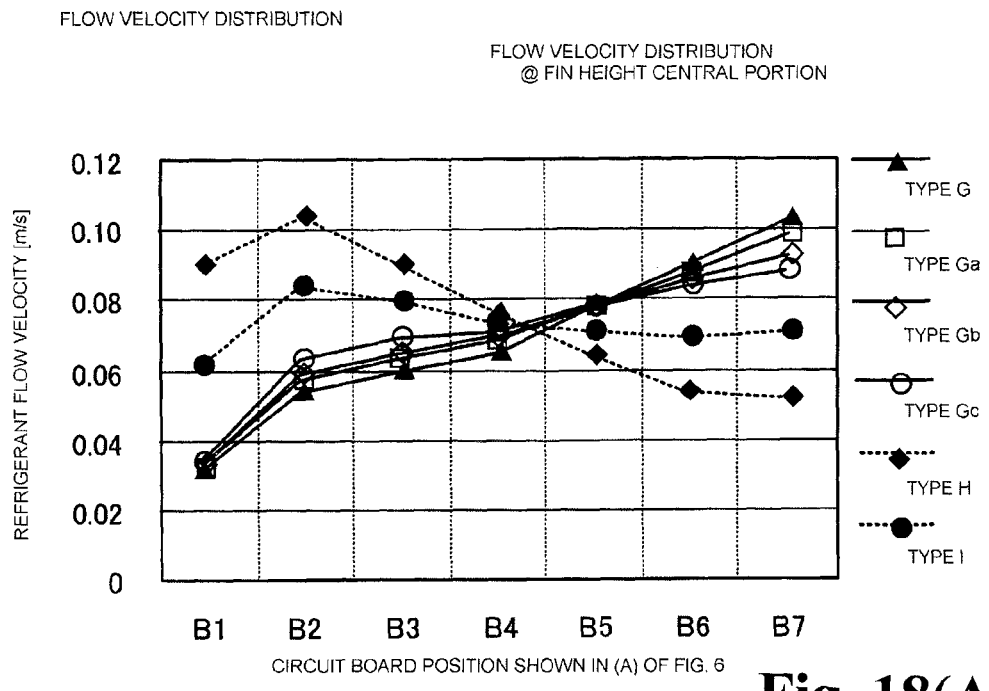
Figure 18B:
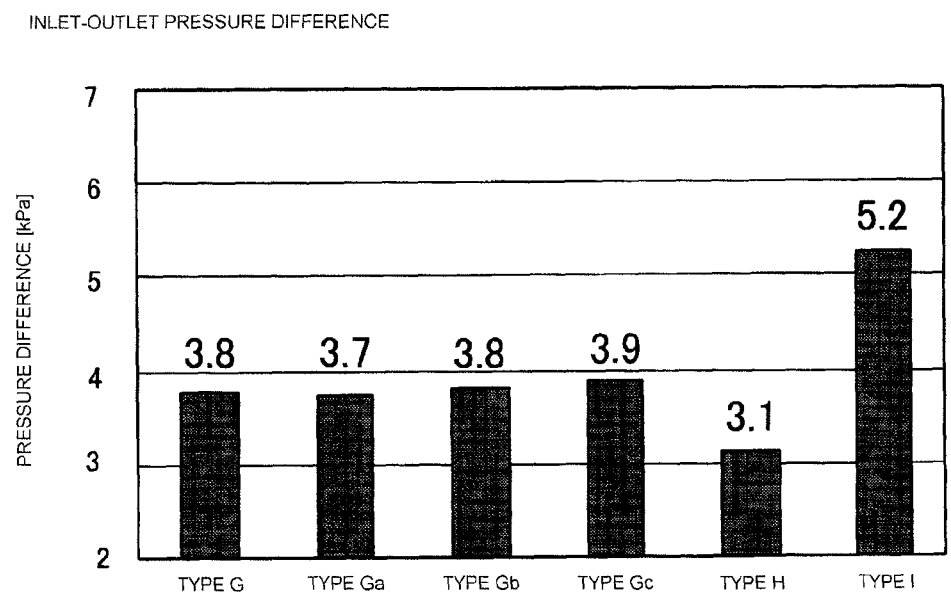

FIGS. 18(A), 18(B) show cooling characteristics of the water jackets of FIG. 16, wherein FIG. 18(A) is a diagram showing for each type a refrigerant flow velocity distribution per circuit board position, and FIG. 18(B) is a diagram showing for each type a pressure loss difference between at the inlet and at the outlet.

The flow velocity distributions shown in FIG. 18(A) are simulated immediately below the central portions of the boards of the circuit element portions 3D to 3I, 3Iu, and 3Id disposed in the circuit board positions B1 to B7 shown in FIG. 6(A), and the refrigerant flow velocity distributions are compared by type for each of the positions B1 to B7. Also, the pressure loss difference is a pressure difference between at the inlet 24 and at the outlet 25.

Simulation results obtained from the type G, type Ga, type Gb, type Gc, type H, and type I are shown here. With each of the types G, Ga, Gb, and Gc wherein the flow velocity adjustment plates 28 are installed in their respective refrigerant inlet flow paths 21 with a flow path width W1 of 10 mm so as to have different heights h of 2, 4, 6, and 8 mm, it can be seen that it is possible to adjust the flow velocity distribution into uniformity by reducing the refrigerant flow velocity particularly in the circuit board position B7. Also, according to the simulation results obtained from the types G to Gc, type H, and type I with their respective refrigerant inlet flow paths 21 set to have different flow path widths W1 of 10 mm, 15 mm, and 12.5 mm, the difference between the maximum flow velocity and minimum flow velocity is smallest in a case (the type T) in which the difference between the flow path width W1 of the refrigerant inlet flow path 21 and the flow path width W2 of the refrigerant outlet flow path 22 is 2.5 mm. Further, with the type H wherein the flow path width W1 is equal to the flow path width W2 (−15 mm), the flow velocity is reversed in the circuit board positions B1 and B7. That is, the uniformity in flow velocity distribution is best realized with the water jacket 2A of type I with the flow path width W1 of the refrigerant inlet flow path 21 set to 12.5 mm.

However, even with the type H with the respective widths W1 and W2 of the inlet 24 and outlet 25 set to 15 mm, by setting the height h of the flow velocity adjustment plate 28 thereof to 8 mm, the lowest value of the refrigerant flow velocity is improved to 0.05 m/sec, compared with the lowest value (=0.04 m/sec) in the heretofore known type A with no flow velocity adjustment plate 28. Because of this, the flow velocity distribution in the cooling flow paths 23 is brought into uniformity, and it is possible to adjust the flow velocity in accordance with the loss incurred in each circuit. Meanwhile, according to the pressure losses shown in FIG. 18(B), the pressure difference is 5.2 kPa in the water jacket 2A of type I, and a change in pressure loss depends on the width W1 of the refrigerant inlet flow path 21. This shows that the uniformity in refrigerant flow velocity distribution is in a trade-off relationship with the pressure loss difference.

Also, the narrower the clearance y2 (set herein to 2 mm in any type) between the fins 2C and flow velocity adjustment plate 28, the greater the effect of adjusting the flow velocity distribution into uniformity, but this leads to an increase in pressure loss in the water jacket 2A. However, as the maximum pressure difference is 6 kPa or less in the water jacket 2A of any one of types G to Gc, type H, or type I, these maximum pressure differences are within a range of a pressure loss difference of 10 kPa or less supposed in the water jacket 2A, and even with the heretofore known pump performance, no problem arises in causing a sufficient refrigerant flow rate to flow.

In this way, with each water jacket 2A in this embodiment wherein the inlet 24 and outlet 25 of the cooler are formed on the same surface side, and the flow velocity adjustment plate 28 is disposed in the boundary position between the refrigerant outlet flow path 22 and cooling flow paths 23, it is possible to bring the urged flow distribution into uniformity by making the length of the flow velocity adjustment plate 28 the same as that of the refrigerant outlet flow path 22 and reducing the flow path width w1 of the refrigerant inlet flow path 21 to a certain extent. Consequently, in the second embodiment, by bringing the urged flow distribution of the refrigerant flow velocity in the water jacket 2A into uniformity, it is possible to obtain a flow velocity distribution with good cooling efficiency even when the upstream side circuit element portions and downstream side circuit element portions are substantially constant in heat loss.

The above description simply illustrates the principle of the invention. Furthermore, a great number of modifications and alterations are possible for those skilled in the art and, the invention not being limited to the heretofore illustrated and described exact configurations and applications, all corresponding modification examples and equivalents are deemed to be within the scope of the invention defined by the attached claims and their equivalents.

REFERENCE SIGNS LIST

2 Cooler
2A Water jacket
2B Fin base
2C Fin
3A to 3I, 3Iu, 3Id Circuit element portion
10, 10A Semiconductor module
21 Refrigerant inlet flow path
21a Inlet portion
21Si, 22So Guide portion
22 Refrigerant outlet flow path
22a Outlet portion
23 Cooling flow paths
24 Inlet
25 Outlet
26 Base material
27 Separation wall
28 Flow velocity adjustment plate
31 Board
31a Insulating substrate
31b, 31c Conductor pattern
32, 33 Semiconductor device
34, 35 Joining layer
40 Inverter circuit
41 Three-phase alternating current motor
C Clearance
B1 to B7 Circuit board position
x Width of cooling flow paths
x2, y2 Clearance of flow velocity adjustment plate
w1, w2 Flow path width

What is claimed is:

1. A semiconductor module cooler, comprising:
a water jacket to which a refrigerant is adapted to be supplied from outside for cooling a semiconductor device disposed outside the water jacket;
a heat sink thermally connected to the semiconductor device and having a plurality of fins;
a first flow path disposed inside the water jacket and extending from a refrigerant inlet, the first flow path including a guide portion having an inclined surface for guiding the refrigerant toward one side surface of the heat sink;
a second flow path disposed inside the water jacket parallel to the first flow path at a distance therefrom and extending toward a refrigerant outlet, the second flow path being formed with a sidewall parallel to the other side surface of the heat sink;
a flow velocity adjustment plate disposed in the second flow path and formed parallel to the other side surface of the heat sink at a distance therefrom; and
a third flow path formed at a position communicating the first flow path and the second flow path inside the water jacket,
wherein the plurality of fins is disposed in the third flow path such that a clearance exists between leading ends of the plurality of fins and a bottom wall of the water jacket, and
the flow velocity adjustment plate protrudes upwardly from the bottom wall of the water jacket and is arranged at a boundary between the second flow path and the third flow path with a space relative to the plurality of fins to intersect therewith.

2. The semiconductor module cooler according to claim 1, wherein the flow velocity adjustment plate has one end portion thereof positioned in a terminating end portion of the second flow path, and disposed to extend parallel to the heat sink at the distance from the other side surface of the heat sink.

3. The semiconductor module cooler according to claim 1, wherein the flow velocity adjustment plate has one end portion thereof positioned at a predetermined distance from a terminating end portion of the second flow path at a refrigerant outlet side of the second flow path, and disposed to extend parallel to the heat sink at the distance from the other side surface of the heat sink.

4. The semiconductor module cooler according to claim 2, wherein the other end portion of the flow velocity adjustment plate is disposed at a distance equal to or greater than 0.05x, for a length x of the second flow path, from a guide portion formed in a starting end portion of the second flow path.

5. The semiconductor module cooler according to claim 2, wherein the flow velocity adjustment plate is formed to have a height above 0.2 h and below 0.9 h, for a height h of the second flow path, from a bottom surface of the water jacket.

6. The semiconductor module cooler according to claim 1, wherein the flow velocity adjustment plate has a length equal to a length of the second flow path and is formed to have a height above 0.2 h and below 0.9 h, for a height h of the second flow path, from a bottom surface of the water jacket.

7. A semiconductor module, comprising:
a water jacket for forming a cooler, to which a refrigerant is adapted to be supplied from outside for cooling a semiconductor device disposed on an outer surface of the cooler;
a heat sink adapted to be thermally connected to the semiconductor device and having a plurality of fins;
a first flow path disposed inside the water jacket and extending from a refrigerant inlet, the first flow path being arranged with a guide portion having an inclined surface for guiding the refrigerant toward one side surface of the heat sink;

a second flow path disposed inside the water jacket parallel to the first flow path at a distance therefrom and extending toward a refrigerant outlet, the second flow path being formed with a sidewall parallel to the other side surface of the heat sink;

a flow velocity adjustment plate disposed in the second flow path and formed parallel to the other side surface of the heat sink at a distance therefrom; and a third flow path formed at a position communicating the first flow path and second flow path inside the water jacket, wherein the refrigerant inlet and refrigerant outlet are formed in a same wall surface of the water jacket, the plurality of fins is disposed in the third flow path such that a clearance exists between leading ends of the plurality of fins and a bottom wall of the water jacket, and the flow velocity adjustment plate protrudes upwardly from the bottom wall of the water jacket and is arranged at a boundary between the second flow path and the third flow path with a space relative to the plurality of fins to intersect therewith.

8. The semiconductor module cooler according to claim 1, wherein the flow velocity adjustment plate extends in a direction perpendicular to the plurality of fins.

9. The semiconductor module cooler according to claim 8, wherein the flow velocity adjustment plate extends substantially entirely in a longitudinal direction of the second flow path.

10. The semiconductor module cooler according to claim 7, wherein the flow velocity adjustment plate extends in a direction perpendicular to the plurality of fins.

* * * * *

UNITED STATES PATENT AND TRADEMARK OFFICE
CERTIFICATE OF CORRECTION

Page 1 of 1

PATENT NO. : 9,293,391 B2
APPLICATION NO. : 14/351033
DATED : March 22, 2016
INVENTOR(S) : Hiromichi Gohara et al.

It is certified that error appears in the above-identified patent and that said Letters Patent is hereby corrected as shown below:

Specification

Please change column 1, line 41, from "tins." to --fins.--.

Please change column 8, line 1, from "The semi conductor ..." to --The semiconductor ...--.

Please change column 17, line 50, from "... the type C ..." to --... the type G ...--.

Signed and Sealed this
Twenty-first Day of June, 2016

Michelle K. Lee
*Director of the United States Patent and Trademark Office*